(12) United States Patent
Fulford et al.

(10) Patent No.: US 12,288,747 B2
(45) Date of Patent: Apr. 29, 2025

(54) MULTI-DIMENSIONAL METAL FIRST DEVICE LAYOUT AND CIRCUIT DESIGN

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 442 days.

(21) Appl. No.: 17/740,691

(22) Filed: May 10, 2022

(65) Prior Publication Data

US 2023/0057139 A1 Feb. 23, 2023

Related U.S. Application Data

(60) Provisional application No. 63/235,277, filed on Aug. 20, 2021.

(51) Int. Cl.
*H01L 23/522* (2006.01)
*H01L 21/3105* (2006.01)
*H01L 21/762* (2006.01)

(52) U.S. Cl.
CPC .... *H01L 23/5226* (2013.01); *H01L 21/31053* (2013.01); *H01L 21/762* (2013.01)

(58) Field of Classification Search
CPC ........... H01L 23/5226; H01L 21/31053; H01L 21/762; H01L 21/8221; H01L 21/823871; H01L 27/0688
See application file for complete search history.

(56) References Cited

U.S. PATENT DOCUMENTS

2021/0104523 A1\* 4/2021 Fulford ................. H01L 29/775

\* cited by examiner

*Primary Examiner* — Samuel A Gebremariam
(74) *Attorney, Agent, or Firm* — Oblon, McClelland, Maier & Neustadt, L.L.P.

(57) ABSTRACT

Aspects of the present disclosure provide a method for fabricating a semiconductor structure. For example, the method can include forming a stack of metal structures on a substrate, the stack of metal structures including multiple metal structures that are vertically stacked over and electrically separated from one another, each of the metal structures including a ring and one or more pad contacts extending from the ring, the rings of the metal structures being vertically aligned with one another. The method can also include forming one or more channel structures within the rings of the metal structures, the channel structures being electrically separated from one another and electrically separated from the substrate. The method can also include forming one or more interconnections that extend from a position above the stack of metal structures to corresponding one or more of the pad contacts of the metal structures.

20 Claims, 27 Drawing Sheets

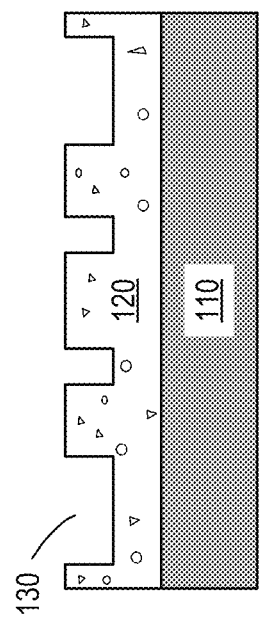
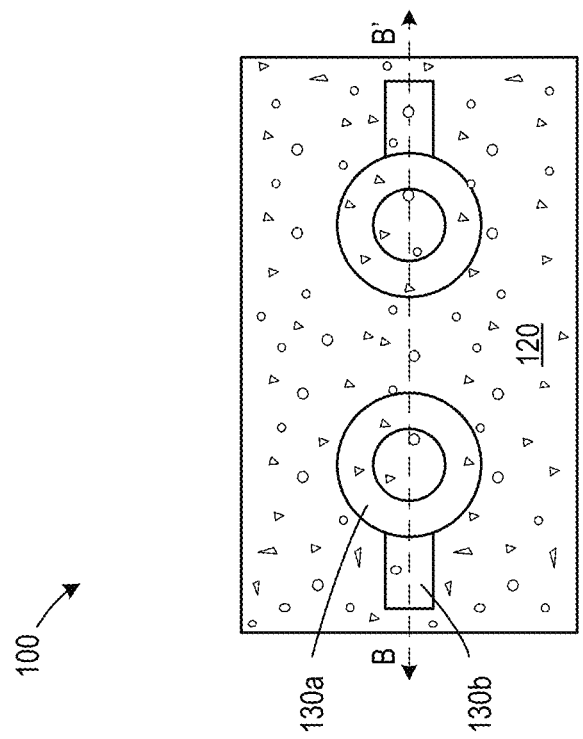

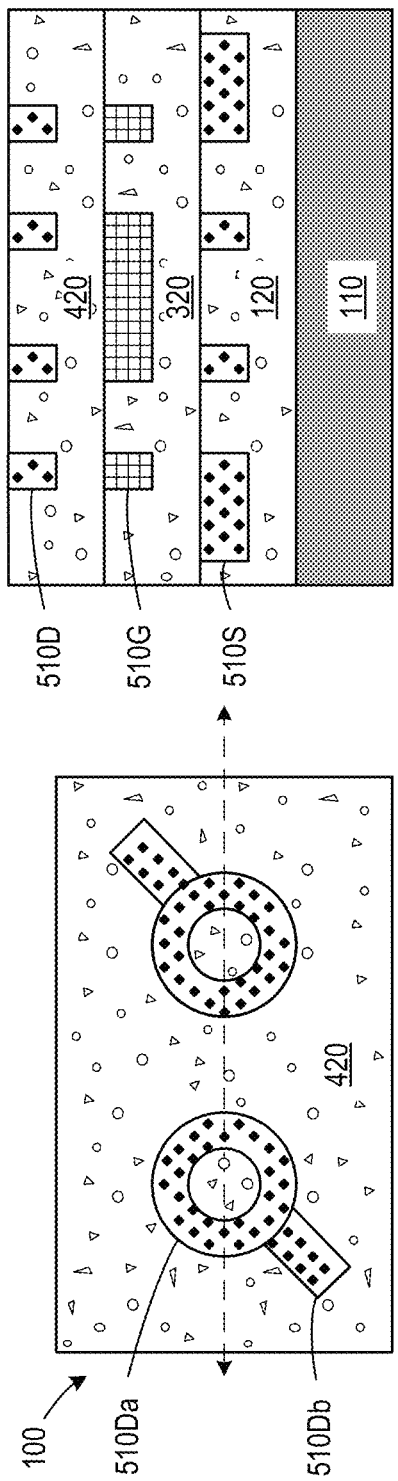
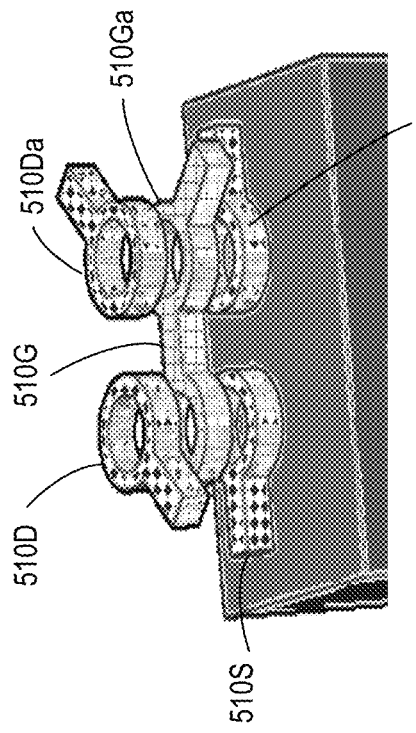
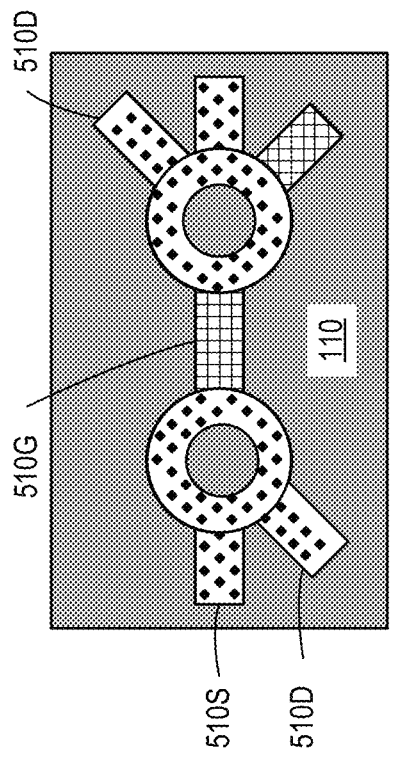

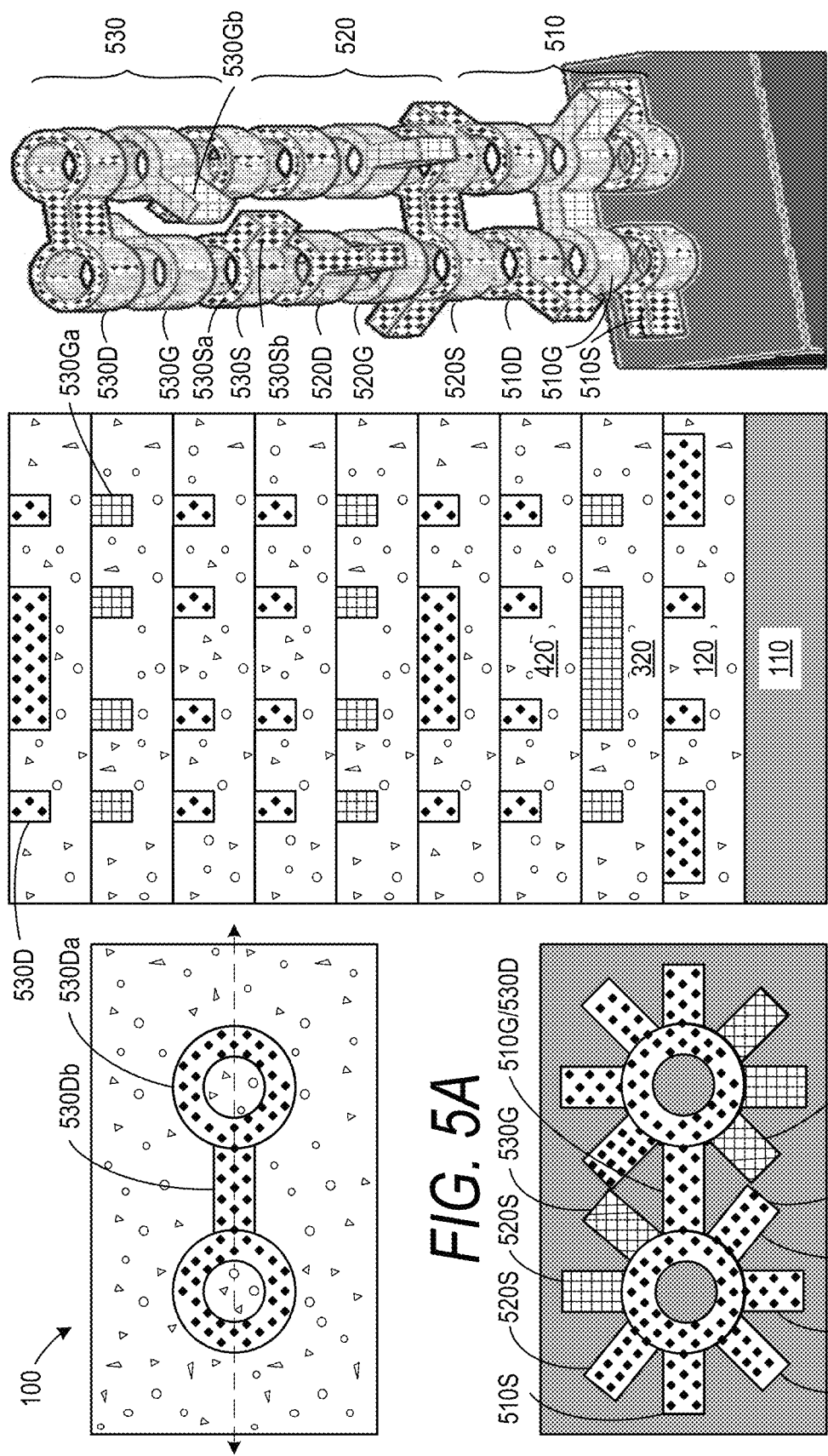

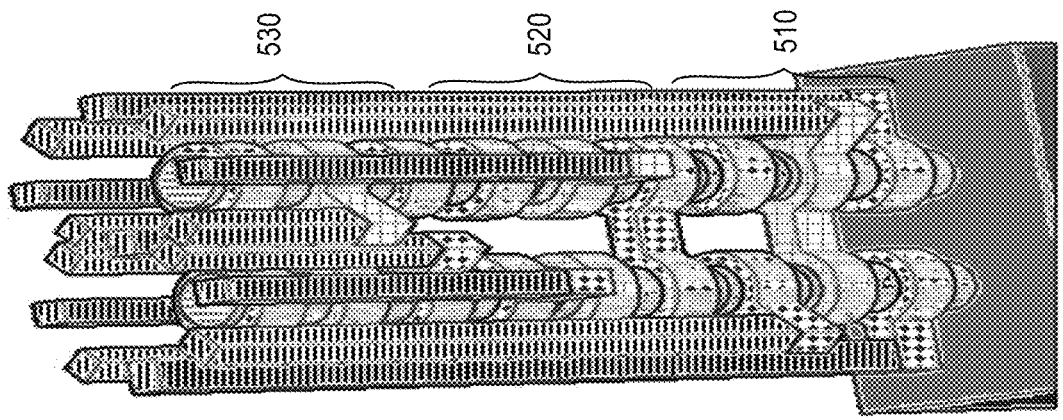
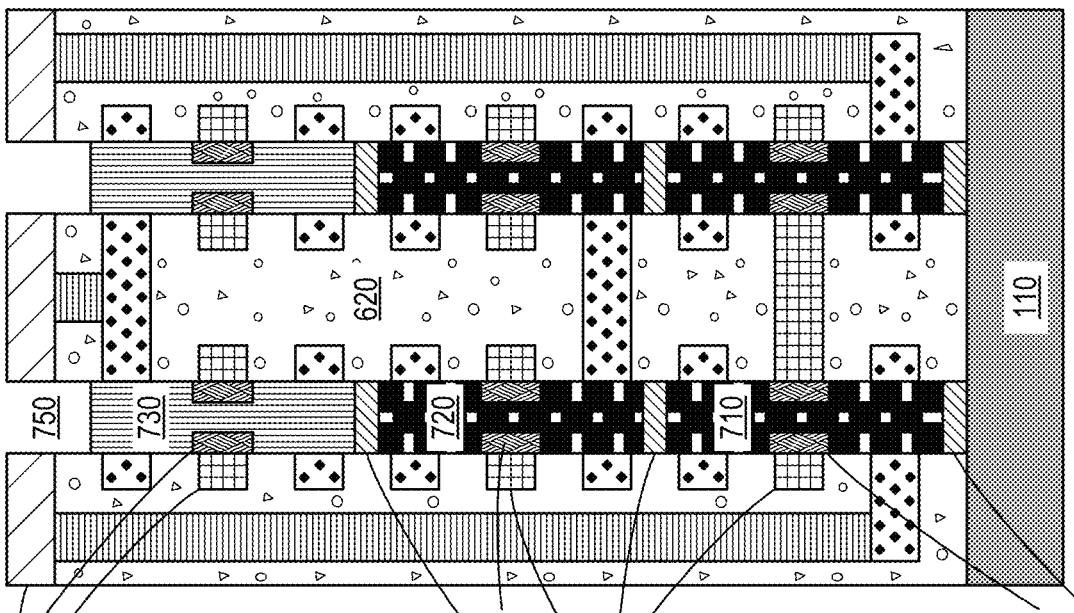
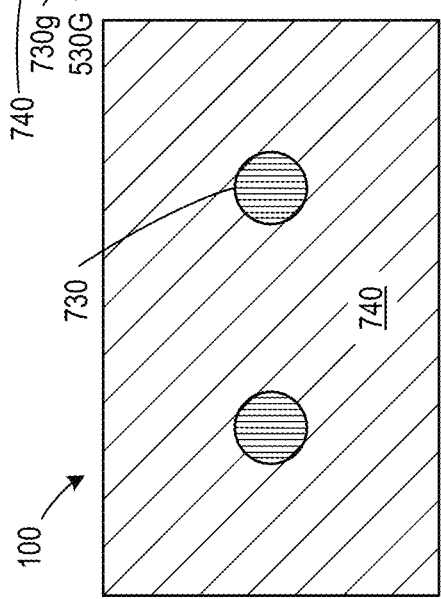
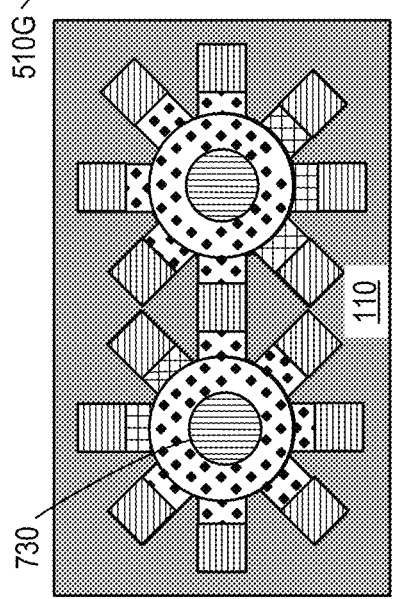

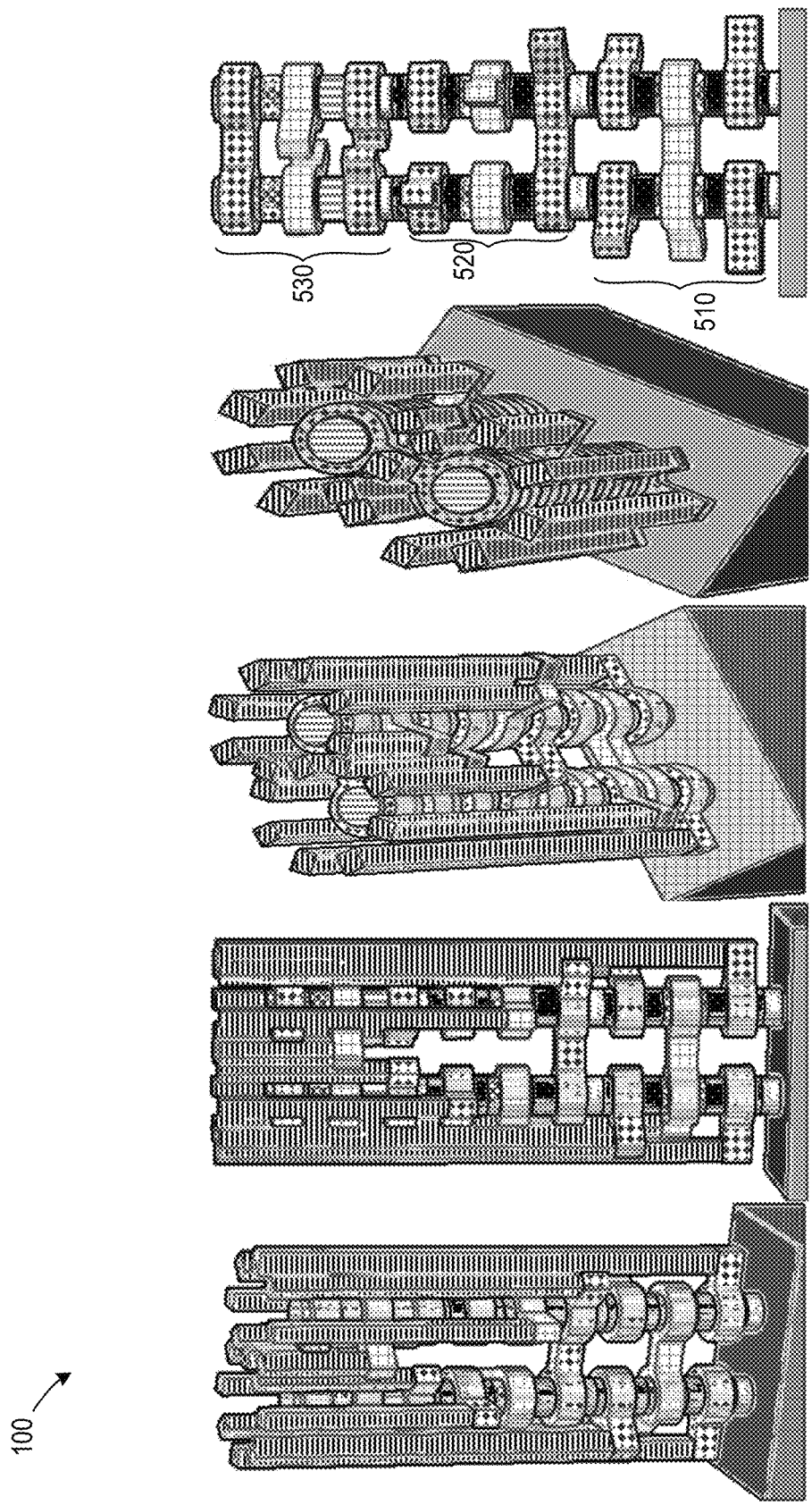

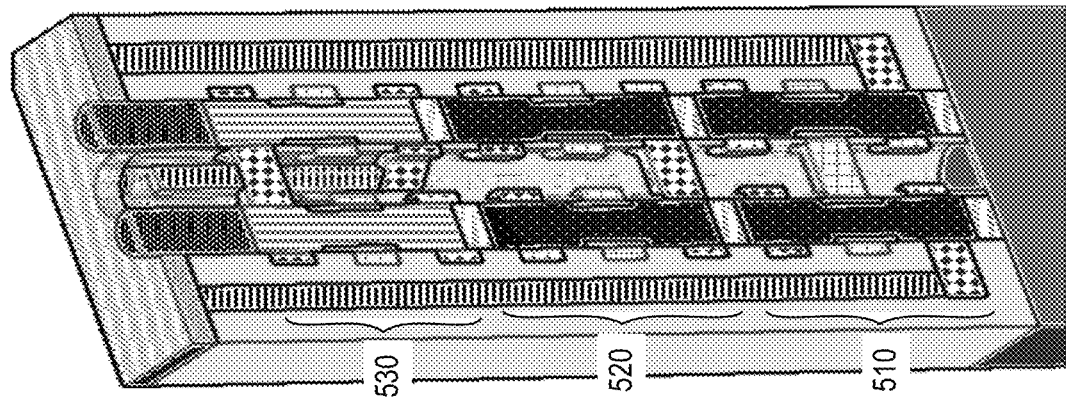
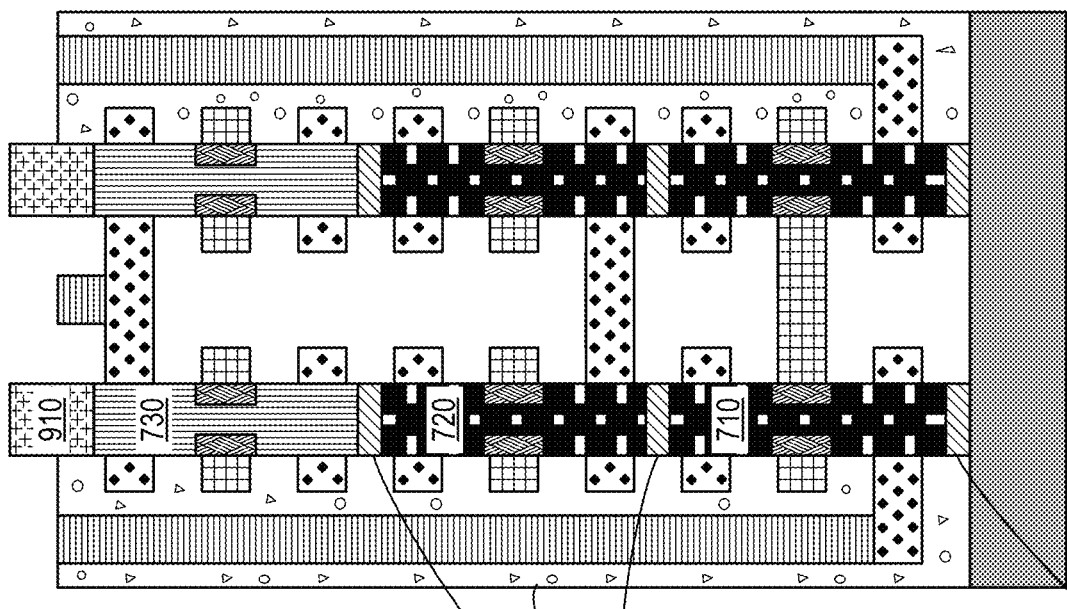
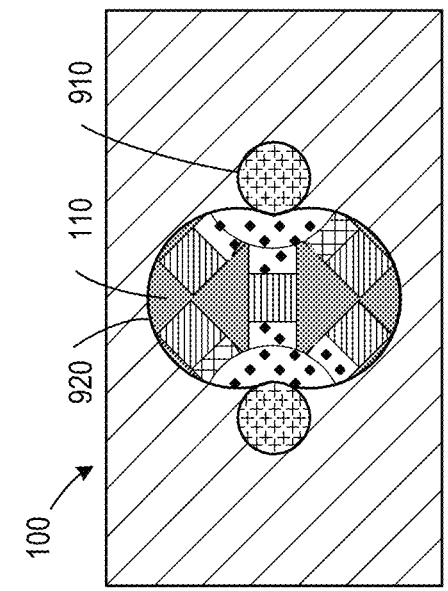
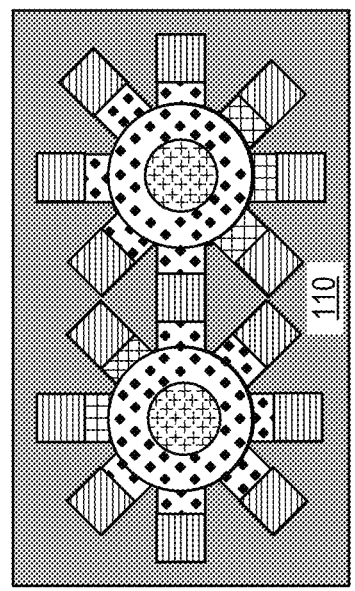
FIG. 10D
FIG. 10C
FIG. 10A
FIG. 10B

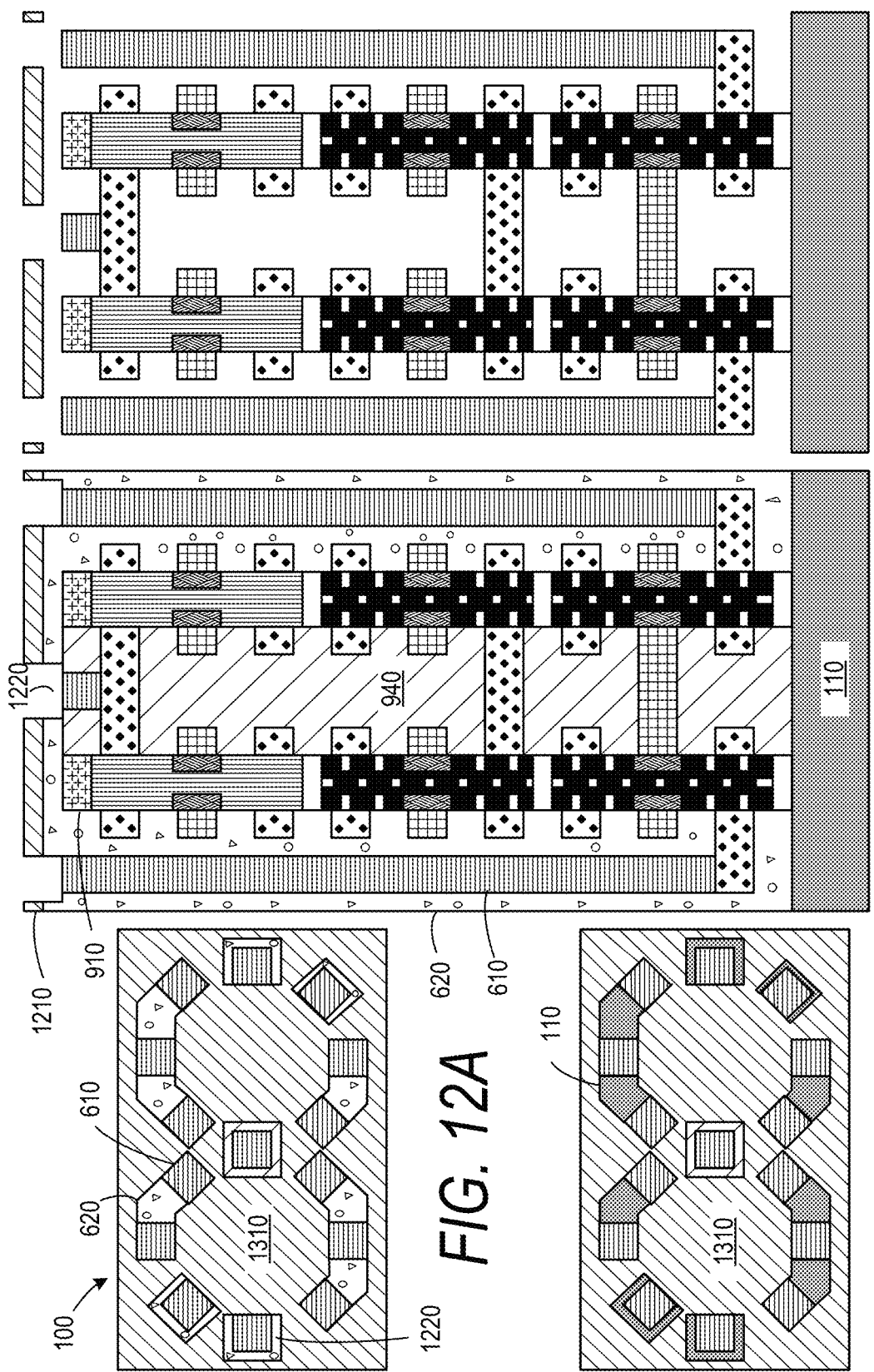

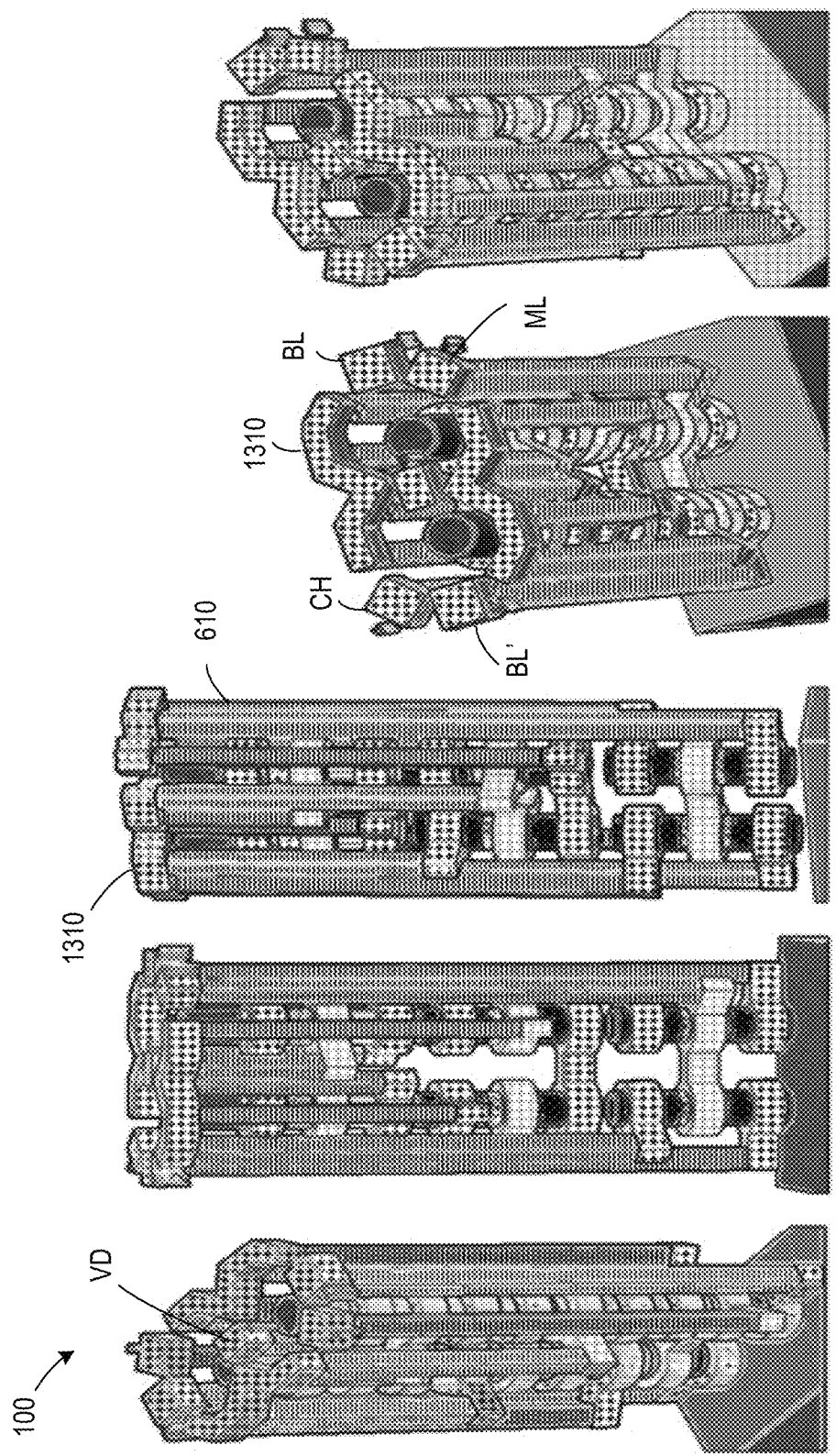

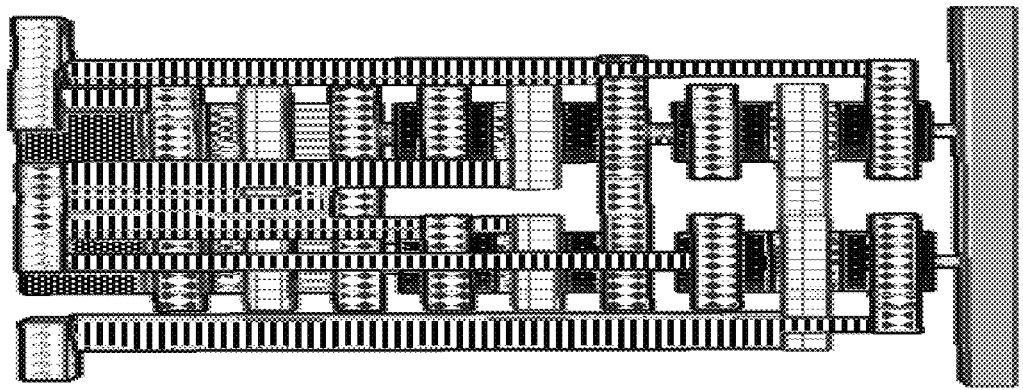
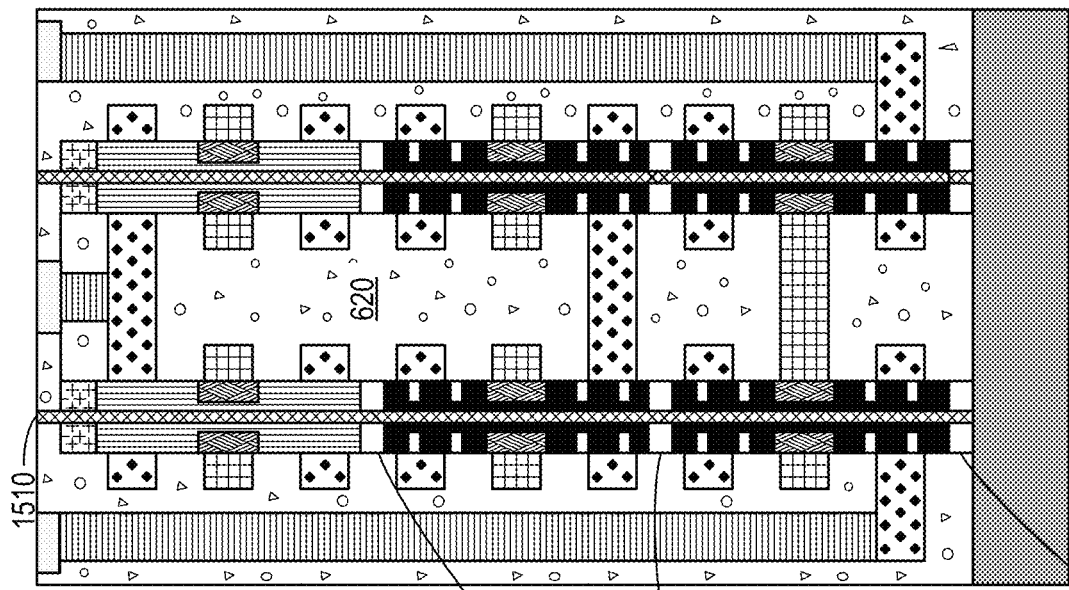
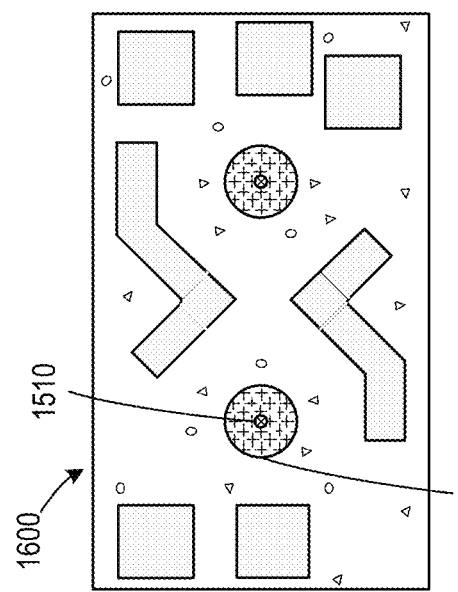
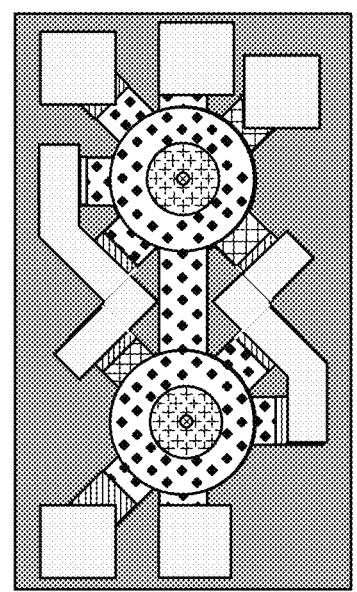
FIG. 16D
FIG. 16C
FIG. 16A
FIG. 16B

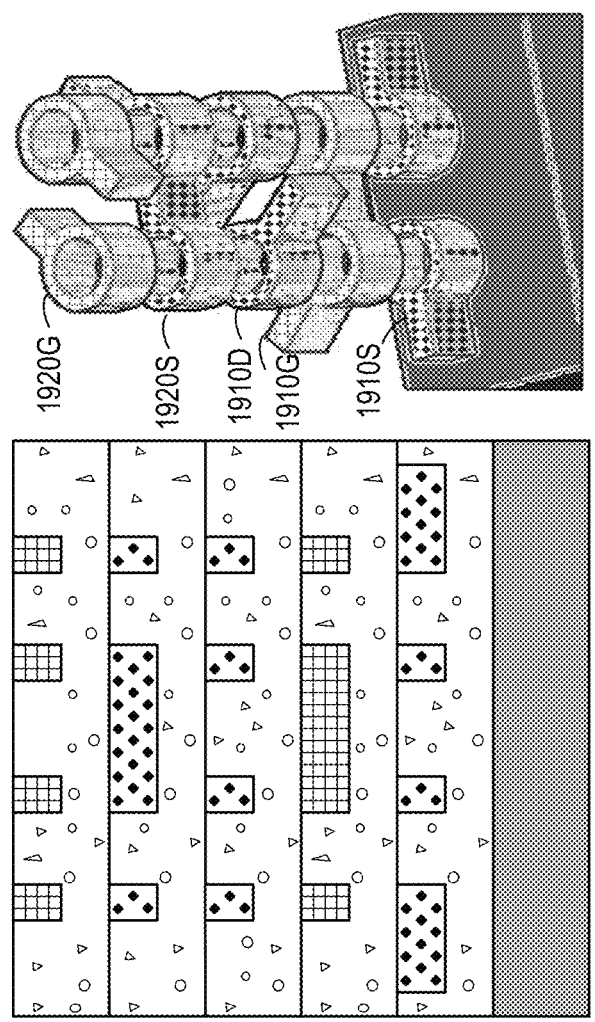
FIG. 17D
FIG. 17C
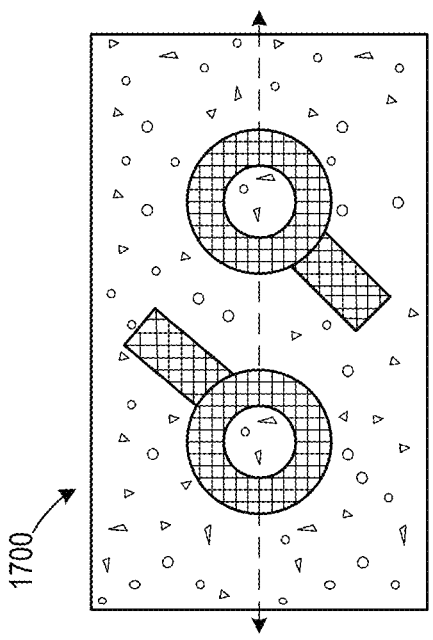
FIG. 17A
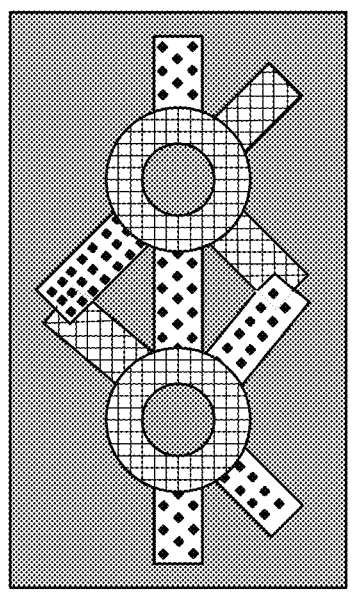
FIG. 17B

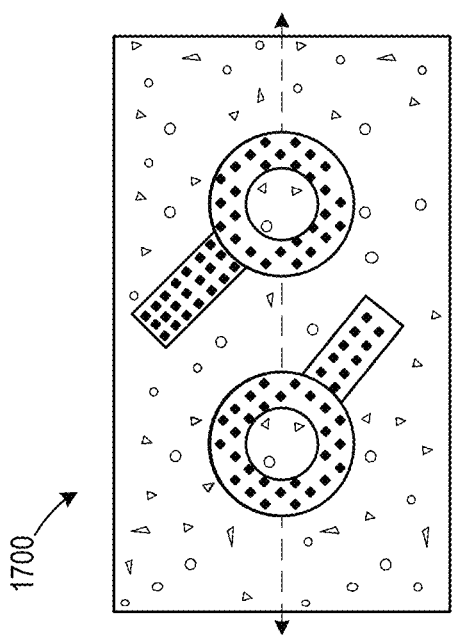
FIG. 18A
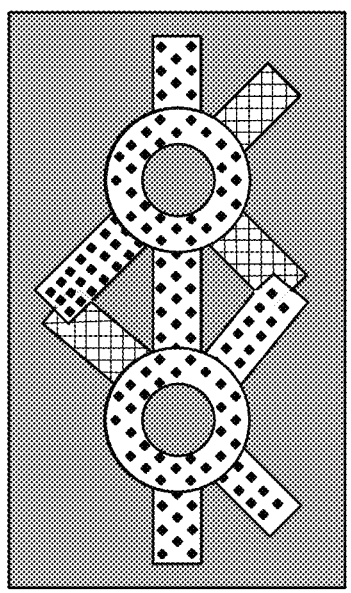
FIG. 18B
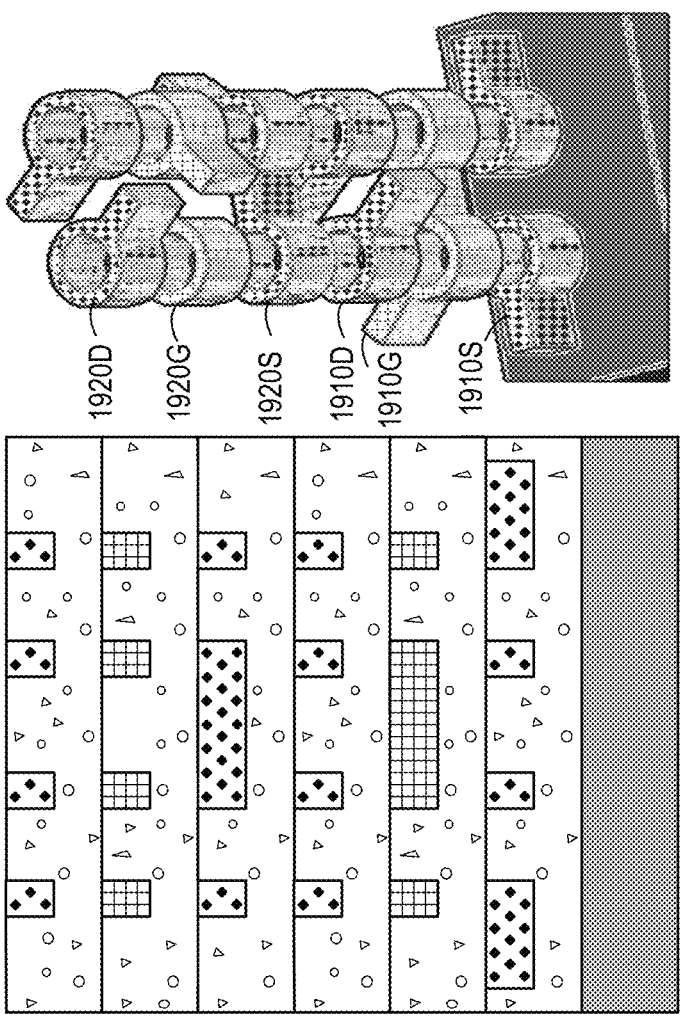
FIG. 18C
FIG. 18D

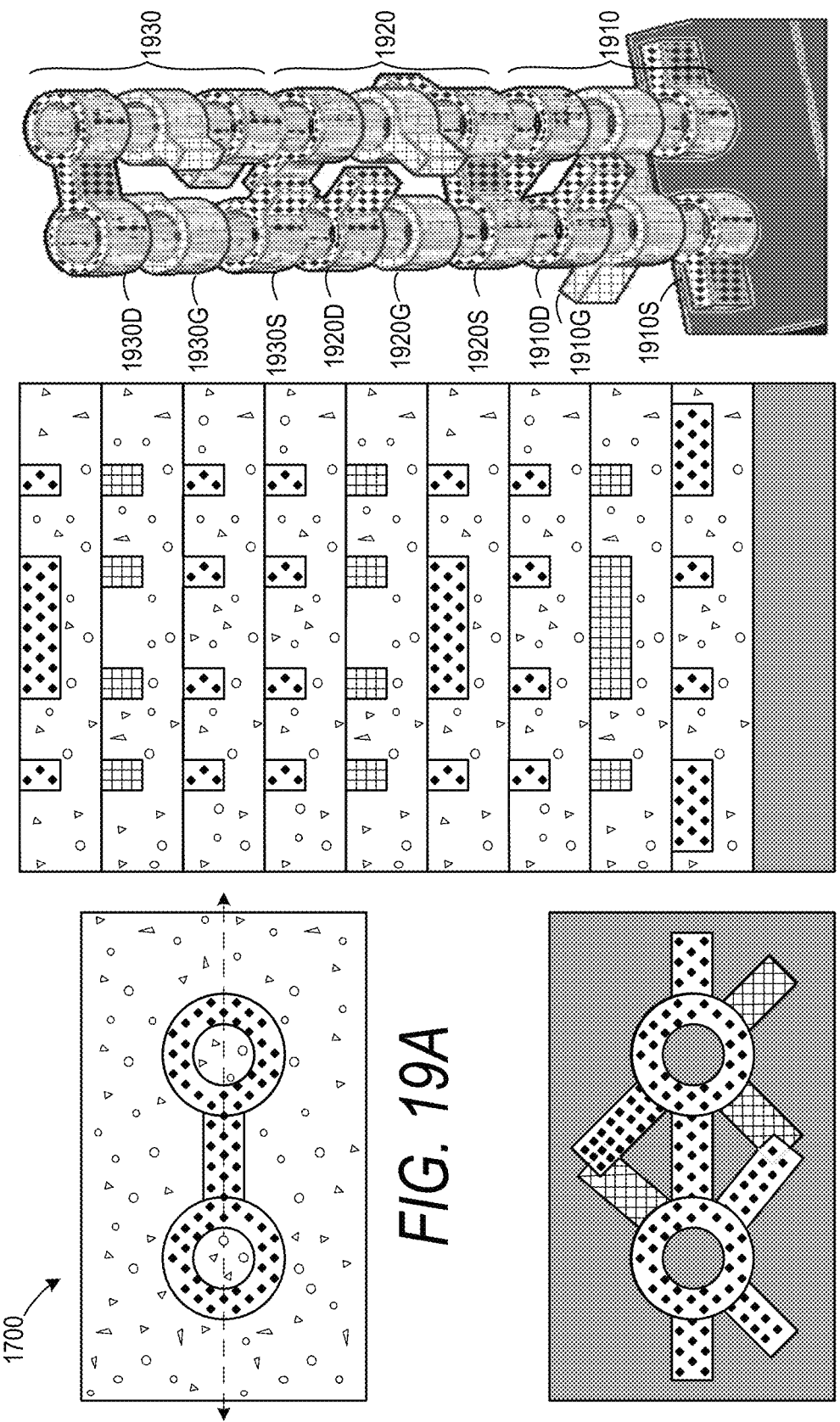

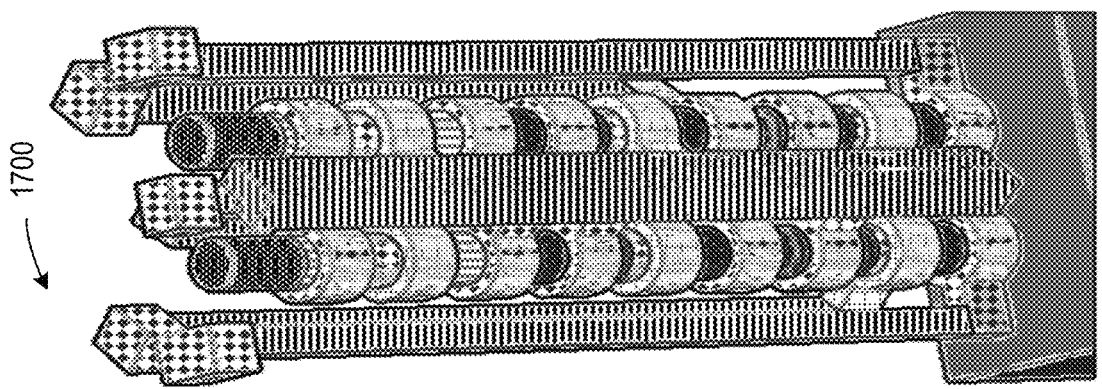
FIG. 23D
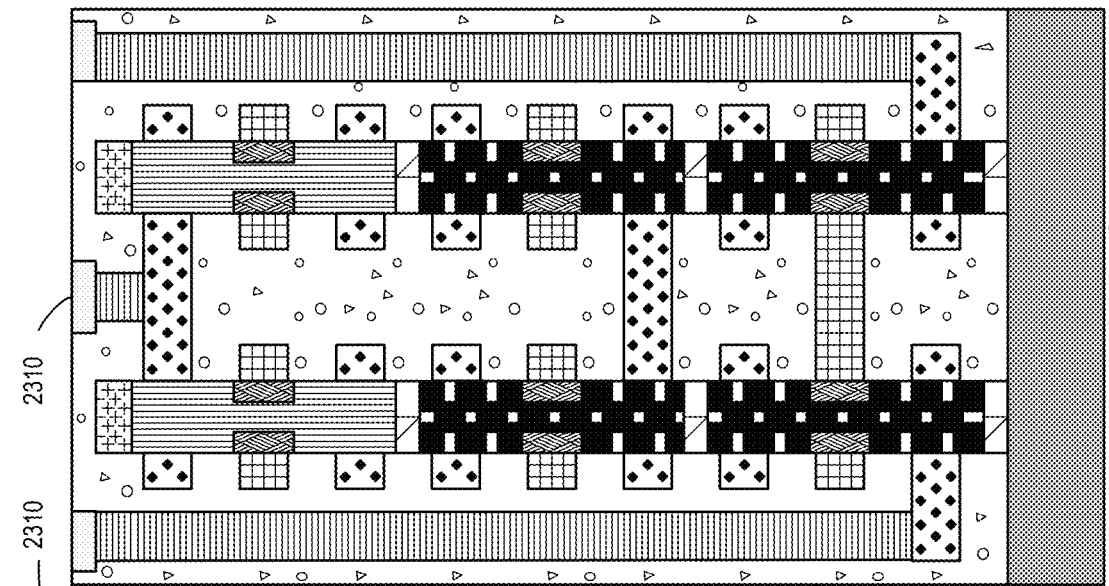
FIG. 23C
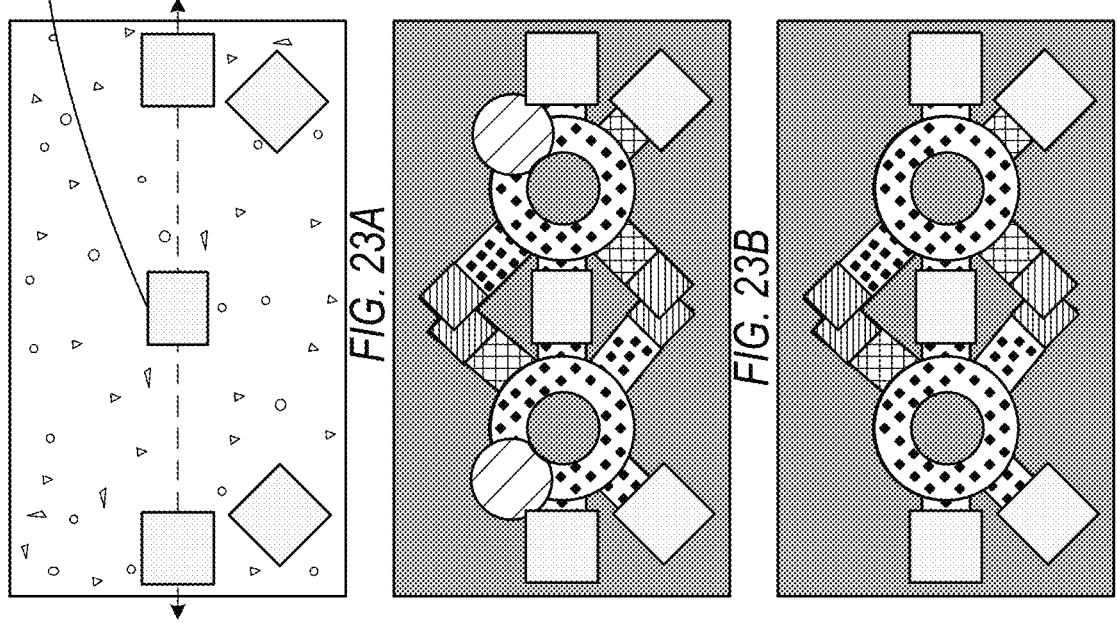
FIG. 23A
FIG. 23B
FIG. 23B'

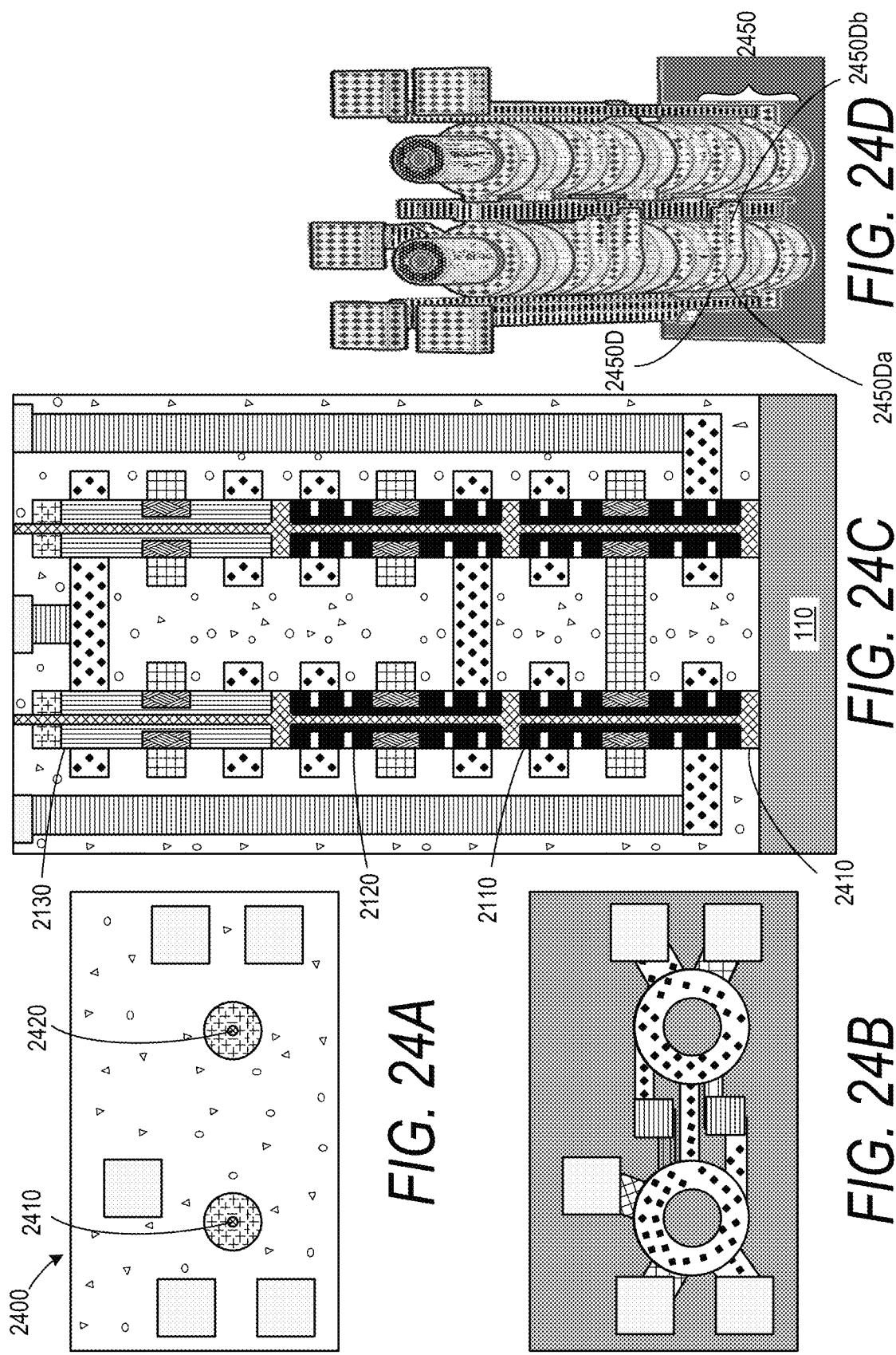

MULTI-DIMENSIONAL METAL FIRST DEVICE LAYOUT AND CIRCUIT DESIGN

INCORPORATION BY REFERENCE

This present disclosure claims the benefit of U.S. Provisional Application No. 63/235,277, entitled "Multi-Dimensional Metal First Device Layout and Circuit Design" filed on Aug. 20, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for fabricating a semiconductor structure. For example, the method can include forming a stack of metal structures on a substrate, the stack of metal structures including multiple metal structures that are vertically stacked over and electrically separated from one another, each of the metal structures including a ring and one or more pad contacts extending from the ring, the rings of the metal structures being vertically aligned with one another. The method can also include forming one or more channel structures within the rings of the metal structures, the channel structures being electrically separated from one another and electrically separated from the substrate. The method can also include forming one or more interconnections that extend from a position above the stack of metal structures to corresponding one or more of the pad contacts of the metal structures.

In an embodiment, the pad contacts can extend at radial directions. For example, the pad contacts of two of the metal structures can extend at the same redial direction. In another embodiment, the pad contacts of two of the metal structures can have different lengths.

In an embodiment, forming one or more channel structures can include forming an opening through the stack of metal structures until uncovering the substrate, forming a sacrificial layer on the substrate, forming a channel structure on the sacrificial layer, and removing the sacrificial layer to form an air gap. In another embodiment, the method can further include filling the air gap with a dielectric material. For example, the air gap can be partially filled with the dielectric material.

In an embodiment, removing the sacrificial layer can include forming a shaft at a side of the stack of metal structures from top of the stack of metal structures to the substrate to uncover the sacrificial layer, and removing the sacrificial layer. In another embodiment, removing the sacrificial layer can include forming a trench hole in a core of the channel structures to uncover the substrate and the sacrificial layer, and removing the sacrificial layer.

In an embodiment, forming a sacrificial layer on the substrate can include epitaxially growing a sacrificial layer on the substrate. In another embodiment, forming a channel structure on the sacrificial layer can include epitaxially growing a channel structure on the sacrificial layer.

In an embodiment, forming the stack of metal structures can include forming a dielectric layer on the substrate, removing a portion of the dielectric layer to form one or more openings, and filling the openings with metal to form the rings and the pad contacts.

Aspects of the present disclosure further provide a semiconductor structure. For example, the semiconductor structure can include a stack of metal structures, the stack of metal structures including multiple metal structures vertically stacked over and electrically separated from one another, each of the metal structures including a ring and one or more pad contacts extending from the ring, the rings of the metal structures being vertically aligned with one another. The semiconductor structure can also include one or more channel structures within the rings of the metal structures, the channel structures being electrically separated from one another. The semiconductor structure can also include one or more interconnections that extend from a position above the stack of metal structures to corresponding one or more of the pad contacts of the metal structures.

In an embodiment, the pad contacts can extend at radial directions. For example, the pad contacts of two of the metal structures can extend at a same redial direction. In another embodiment, the pad contacts of two of the metal structures can have different lengths.

In an embodiment, the semiconductor structure can also include an air gap formed between two of the channel structures. In another embodiment, the semiconductor structure can also include a dielectric material filled in the air gap. For example, the air gap can be partially filled with the dielectric material.

In an embodiment, the channel structures can include a p-type channel structure and an n-type channel structure.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 1A and 1B show a top view and a cross-sectional view of a semiconductor structure with a substrate and a first dielectric layer formed, respectively, according to some embodiments of the present disclosure;

FIGS. 4A, 4B, 4C and 4D show a top view, a top inner view, a cross-sectional view, and a schematic view of the semiconductor structure with third metal structures further formed, respectively, according to some embodiments of the present disclosure;

FIGS. 5A, 5B, 5C and 5D show a top view, a top inner view, a cross-sectional view, and a schematic view of the semiconductor structure with second and third semiconductor devices further formed, respectively, according to some embodiments of the present disclosure;

FIGS. 7A, 7B, 7C and 7D show a top view, a top inner view, a cross-sectional view, and a schematic view of the semiconductor structure with first to third channel structures of the first to third semiconductor devices further formed, respectively, according to some embodiments of the present disclosure;

FIGS. 8A, 8B, 8C, 8D and 8E show various views of the complete semiconductor structure according to some embodiments of the present disclosure;

FIGS. 10A, 10B, 10C and 10D show a top view, a top inner view, a cross-sectional view, and a schematic view of the semiconductor structure with a portion of the first to third semiconductor devices removed, respectively, according to some embodiments of the present disclosure;

FIGS. 12A, 12B, 12C and 12D show a top view, a top inner view, a cross-sectional view, and another cross-sectional view of the semiconductor structure with padding layers to be formed, respectively, according to some embodiments of the present disclosure;

FIGS. 14A, 14B, 14C, 14D and 14E show various views of the complete semiconductor structure according to some embodiments of the present disclosure;

FIGS. 16A, 16B, 16C and 16D show a top view, a top inner view, a cross-sectional view, and a schematic view of a semiconductor structure, respectively, according to some embodiments of the present disclosure;

FIGS. 17A, 17B, 17C and 17D show a top view, a top inner view, a cross-sectional view, and a schematic view of yet another semiconductor structure that is formed after five layers of metal (metal-first) structures are formed, respectively, according to some embodiments of the present disclosure;

FIGS. 18A, 18B, 18C and 18D show a top view, a top inner view, a cross-sectional view, and a schematic view of the semiconductor structure with the sixth metal (metal-first) structure further formed, respectively, according to some embodiments of the present disclosure;

FIGS. 19A, 19B, 19C and 19D show a top view, a top inner view, a cross-sectional view, and a schematic view of the semiconductor structure with the last three metal (metal-first) structures further formed, respectively, according to some embodiments of the present disclosure;

FIGS. 23A, 23B, 23B', 23C and 23D show a top view, a top inner view, another top inner view, a cross-sectional view, and a schematic view of the semiconductor structure with padding layers further formed, respectively, according to some embodiments of the present disclosure;

FIGS. 24A, 24B, 24C and 24D show a top view, a top inner view, a cross-sectional view, and a schematic view of a further semiconductor structure, respectively, according to some embodiments of the present disclosure;

DETAILED DESCRIPTION

Figure 2A:
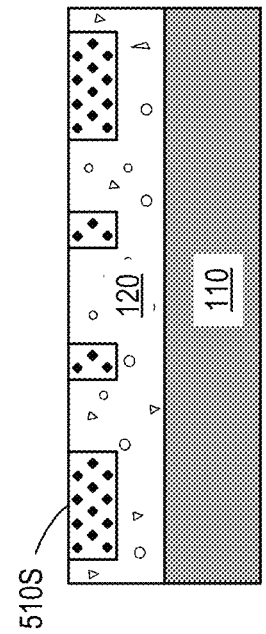
FIGS. 2A, 2B, 2C and 2D show a top view, a top inner view, a cross-sectional view, and a schematic view of the semiconductor structure with first metal structures further formed, respectively, according to some embodiments of the present disclosure.
Figure 2D:
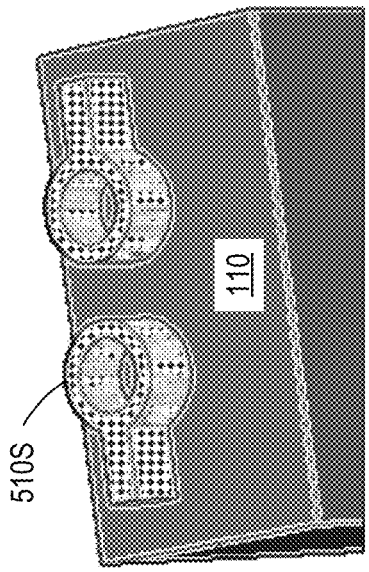
Figure 2C:
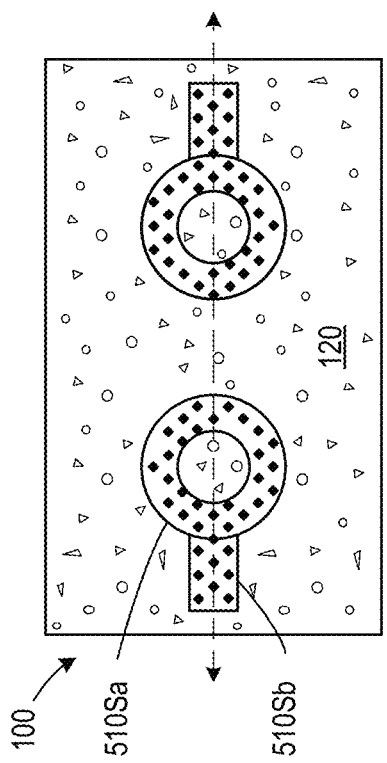
Figure 2B:
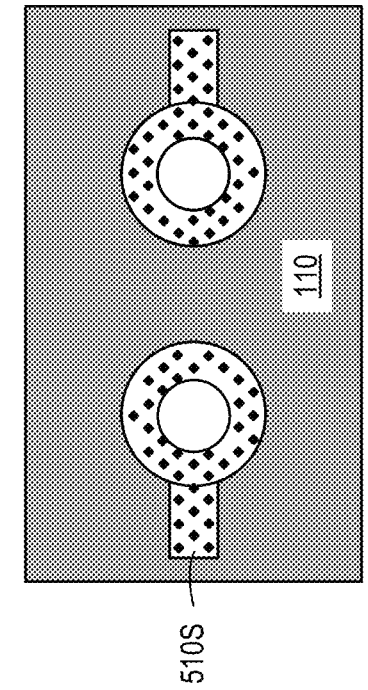
Figure 3A:
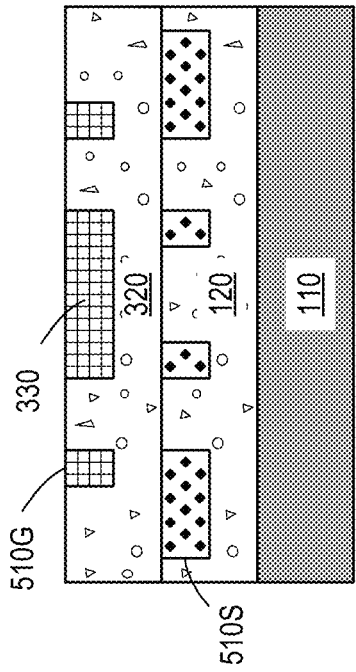
FIGS. 3A, 3B, 3C and 3D show a top view, a top inner view, a cross-sectional view, and a schematic view of the semiconductor structure with second metal structures further formed, respectively, according to some embodiments of the present disclosure.
Figure 3B:
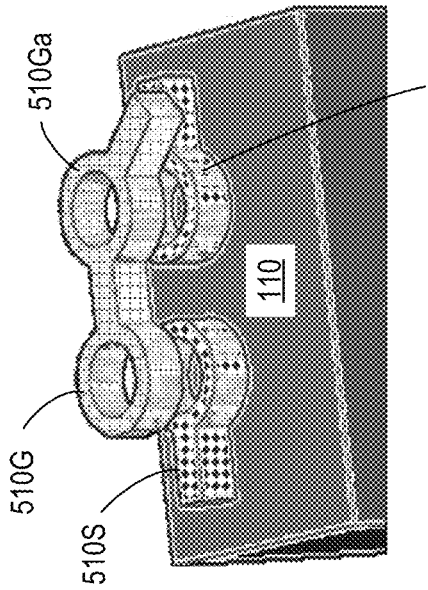
Figure 3C:
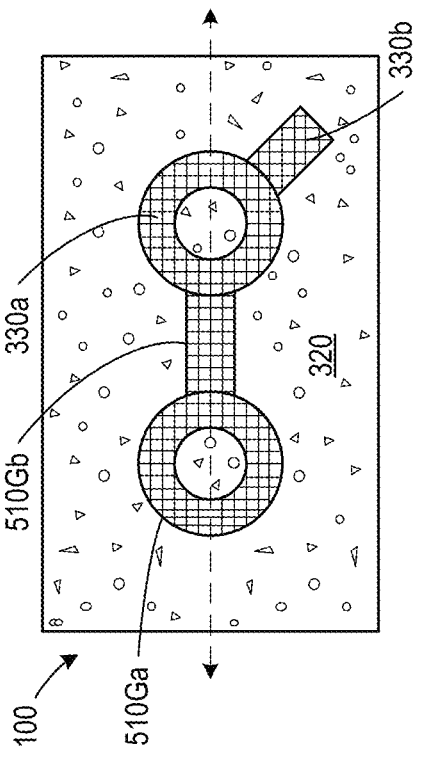
Figure 3D:
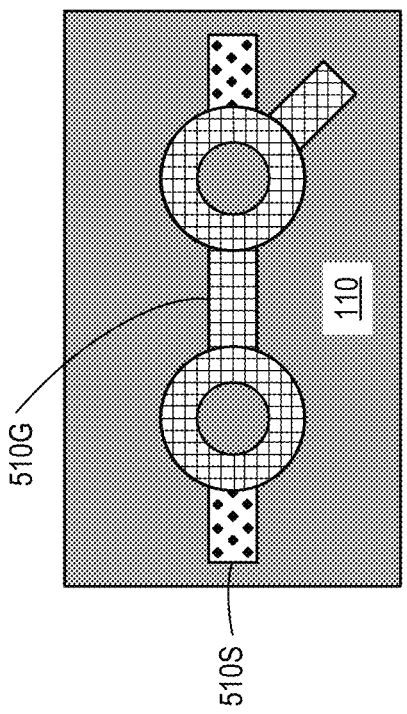
Figure 6D:
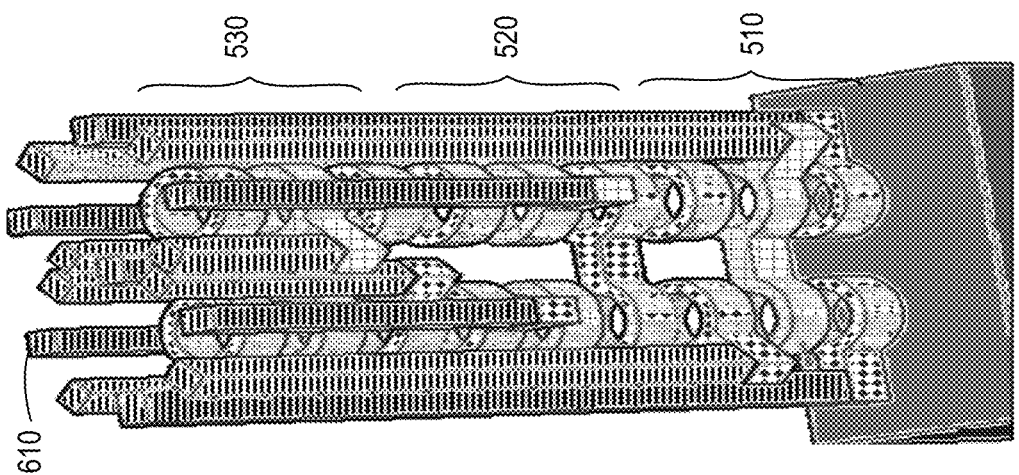
FIGS. 6A, 6B, 6C and 6D show a top view, a top inner view, a cross-sectional view, and a schematic view of the semiconductor structure with interconnections further formed, respectively, according to some embodiments of the present disclosure.
Figure 6C:
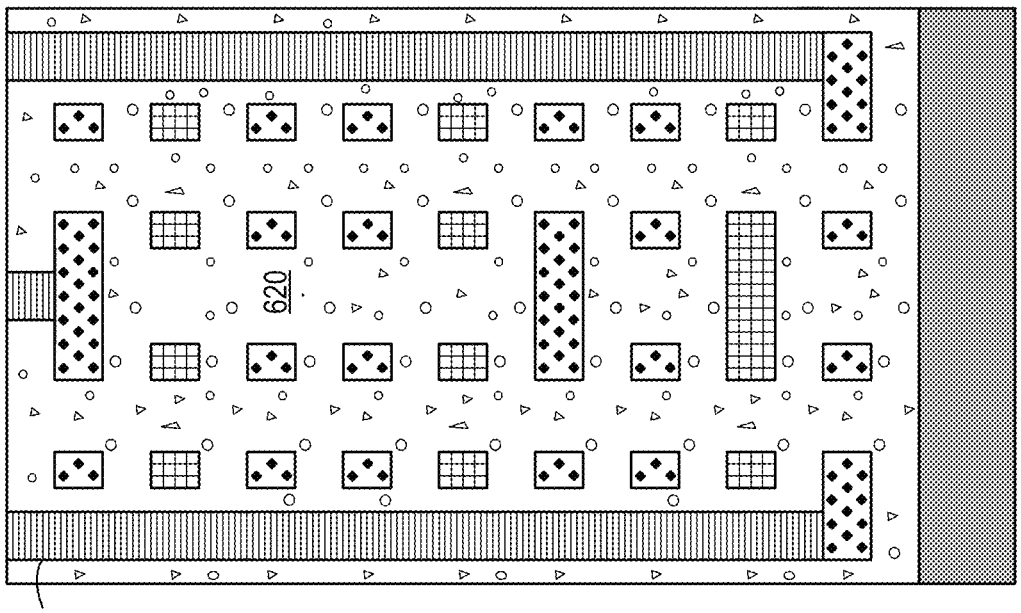
Figure 6A:
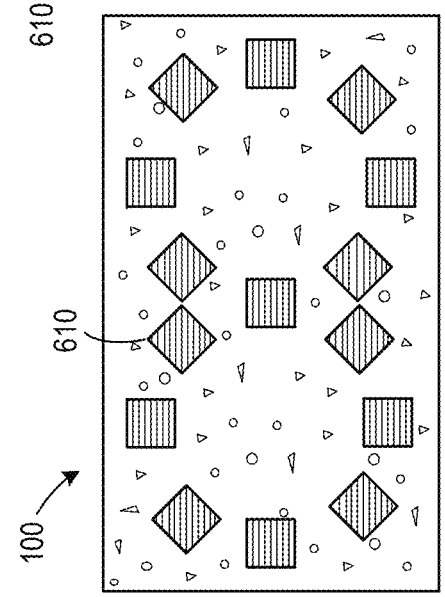
Figure 6B:
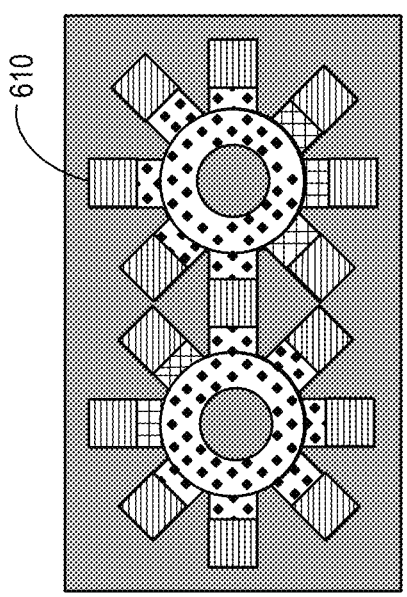
Figure 9D:
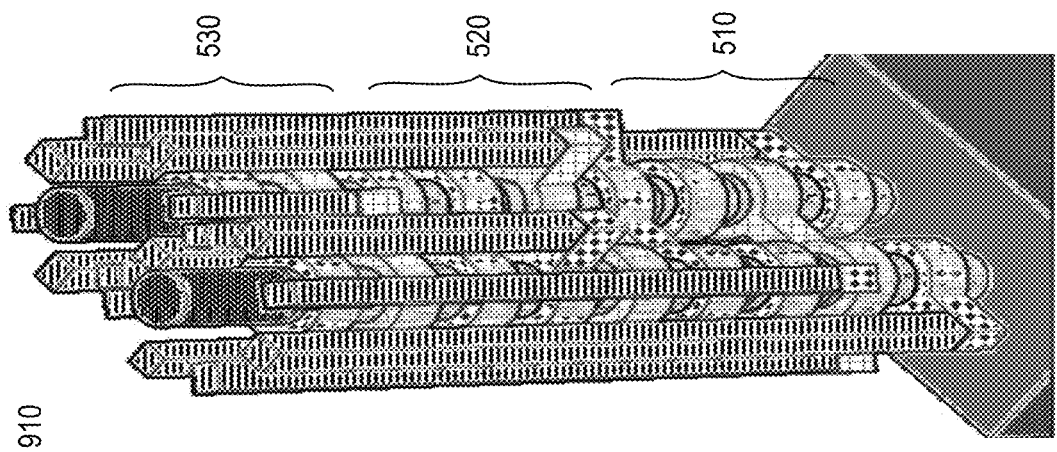
FIGS. 9A, 9B, 9C and 9D show a top view, a top inner view, a cross-sectional view, and a schematic view of the semiconductor structure with cap layers and shafts or holes further formed, respectively, according to some embodiments of the present disclosure.
Figure 9C:
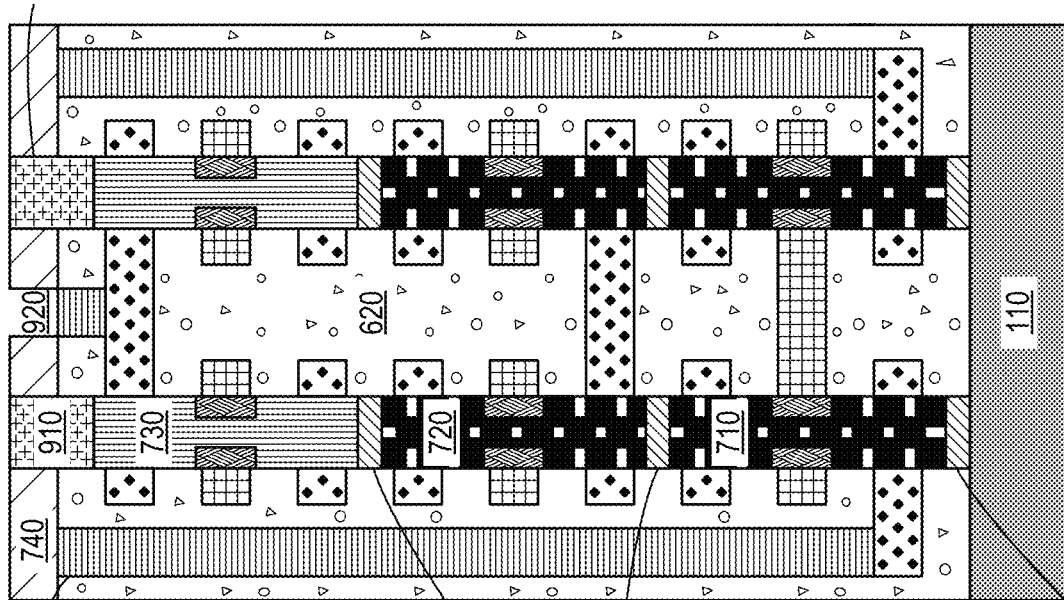
Figure 9A:
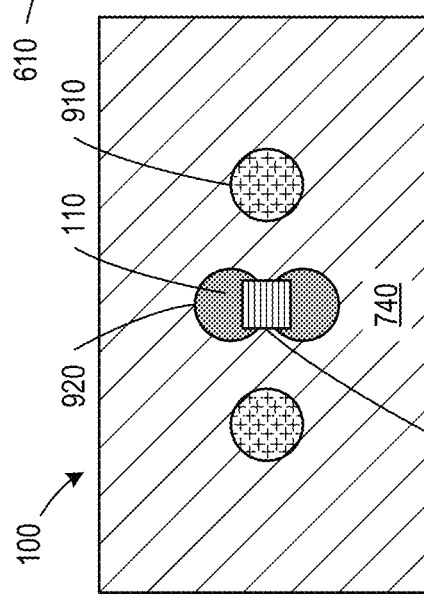
Figure 9B:
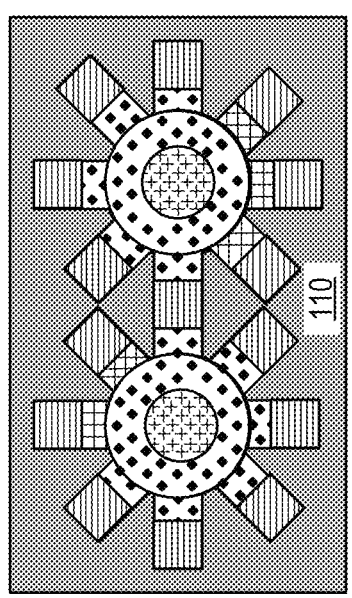
Figure 11D:
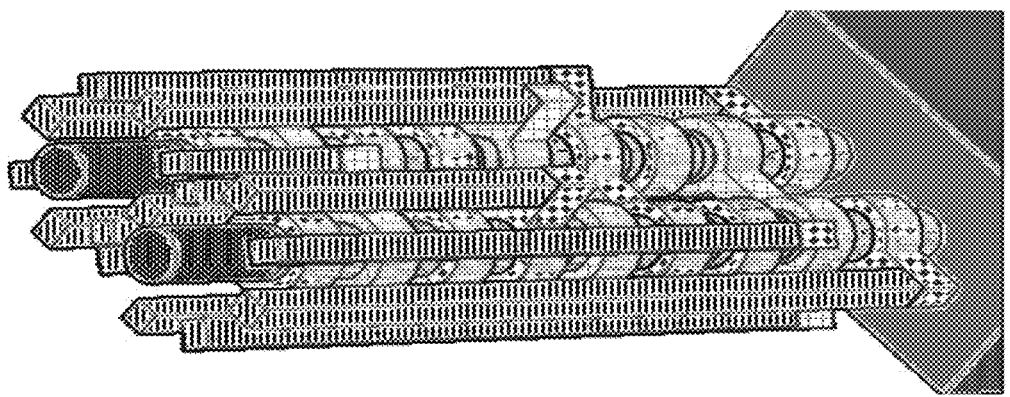
FIGS. 11A, 11B, 11C and 11D show a top view, a top inner view, a cross-sectional view, and a schematic view of the semiconductor structure with the first to third sacrificial layers removed, respectively, according to some embodiments of the present disclosure.
Figure 11C:
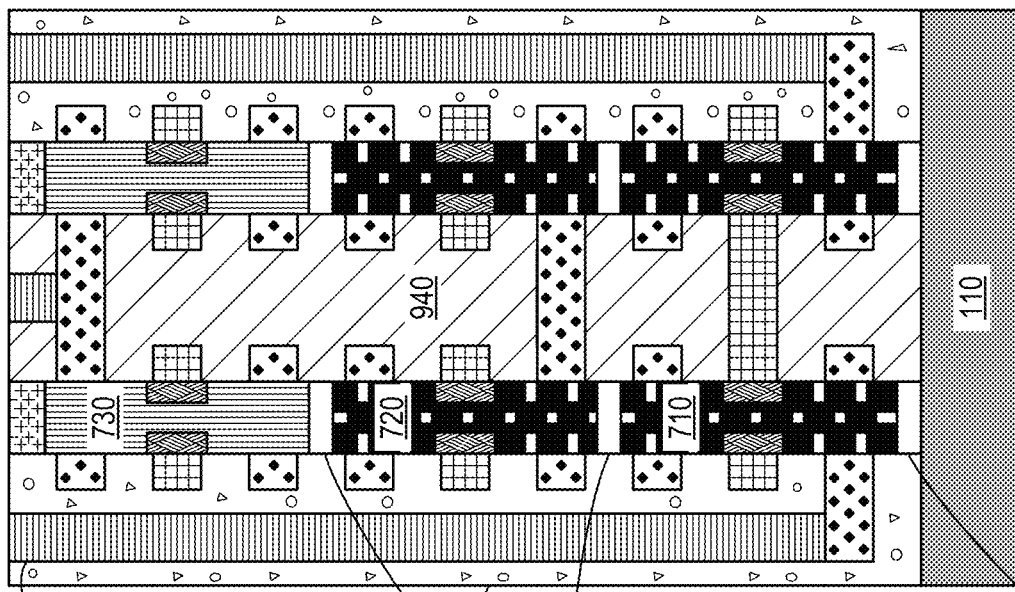
Figure 11A:
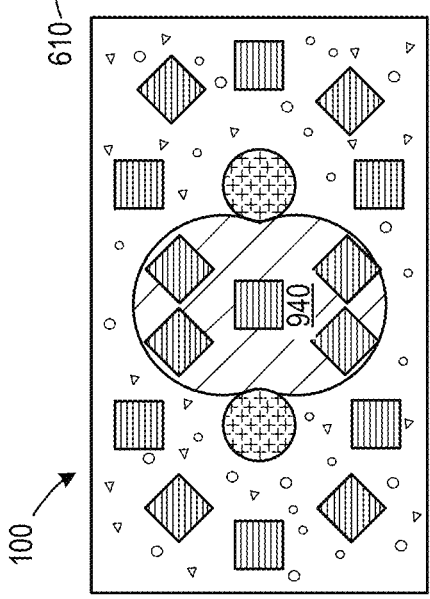
Figure 11B:
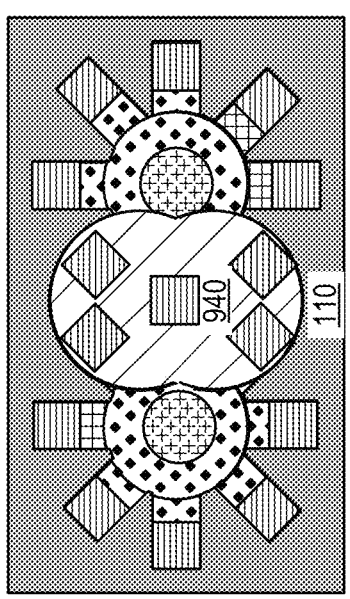

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips, such as central processing units (CPUs), graphics processing units (GPUs), field programmable gate arrays (FPGAs) and system on a chip (SoC), is being pursued.

Techniques herein include methods and designs that enable higher density circuits to be produced at reduced cost. This includes a compact circuit design with N layers of metal structures with a 3D device consisting of N transistors stacked vertically. This technique includes a metal first design that gives enormous freedom to customize the fabrication steps as per the design and make it super compact and highly dense.

Techniques herein include methods and designs for a compact circuit design with N layers of metal structures with a 3D device consisting of N transistors stacked vertically. This technique includes a metal first design providing freedom to customize the fabrication steps as per the design and for compact and highly dense circuits.

Techniques herein provide methods of making 3D metal routing for both the devices and the circuit elements prior to making the transistors and other semiconductor devices. Example embodiments herein include a vertical 3D SRAM Design that routes the 3D metal prior to device formation. Note that this is one example embodiments and techniques herein can be applied to all circuit designs and device connections, especially 3D device architecture. Advantages of hierarchy design have been exercised to interconnect the nodes under a same vertical area while they are actually separated by a different horizontal plane.

Referring now to the figures, process flows will show a multi-level metal-first SRAM circuit design by NMOS and PMOS with the corresponding 3D Layout. A first option includes a shaft or hole on the side of the semiconductor device to etch the SiGe. A second option includes a trench hole in the core of the semiconductor device to etch the SiGe. Structure can be filled up fully with a dielectric. An air-gap can be kept between the semiconductor devices. A third option includes a compact design. Advantages of hierarchy design have been exercised to interconnect the nodes under same vertical area while they are actually separated by different horizontal plain. In a fourth design, a compact design continues with a trench hole in the core of the device to etch SiGe.

Refer to FIGS. 1A and 1B, which show a top view and a cross-sectional view of a semiconductor structure 100 with a substrate and a first dielectric layer formed, respectively, according to some embodiments of the present disclosure. A substrate 110, such as a Si or SiGe substrate, can be provided. A first dielectric layer 120 can be deposited and formed on the substrate 110. A first etch mask (or photoresist, not shown) can be patterned and formed on the first dielectric layer 120. A portion of the first dielectric layer 120 that is not covered by the first etch mask can be etched to form one or more first openings 130 that are separated from one another, for metal to be filled therein to form first metal structures. The first openings 130 can define first rings or cylinders 130a each with one or more first contact extensions 130b protruding from a corresponding one of the first rings 130a. For example, the first opening 130 can include a first ring 130a and a first contact extension 130b. The first etch mask can then be stripped and removed.

Refer to FIGS. 2A, 2B, 2C and 2D, which show a top view, a top inner view (with the first dielectric layer 120 not shown), a cross-sectional view, and a schematic view (with the first dielectric layer 120 not shown) of the semiconductor structure 100 with first metal structures further formed, respectively, according to some embodiments of the present disclosure. Metal, such as tungsten (W), cobalt (Co), ruthenium (Ru), or other high-conductive metals, can be deposited in the first openings 130 (shown in FIG. 1B) and planarized (e.g., chemical-mechanical polish (CMP)) to form first metal structures (or first level metal-first structure or connection segment) 510S that are electrically separated from one another. The first metal structures 510S can include first rings 510Sa each with one or more first pad contacts or lines (or a tab of metal or slab of metal or other protrusion) 510Sb extending from a corresponding one of the first rings 510Sa at different radial directions to different lengths for separate access from a position above the semiconductor structure 100 (e.g., top tier metal routing layer(s)). In the example embodiment, each of the first metal structure 510S can include a first ring 510Sa and a first pad contact 510Sb extending from the first ring 510Sa. The first metal structure 510S can be used to form a source contact 510S of a first semiconductor device 510 (shown in FIG. 5D), and a channel structure of the first semiconductor device 510 can be formed within the first ring 510Sa of the first metal structure 510S.

Refer to FIGS. 3A, 3B, 3C and 3D, which show a top view, a top inner view, a cross-sectional view, and a schematic view of the semiconductor structure 100 with second metal structures further formed, respectively, according to some embodiments of the present disclosure. The process steps performed in FIGS. 1A, 1B and FIGS. 2A, 2B, 2C and 2D can be repeated here to form second metal structures 510G that can be used as gate (e.g., gate-all-around (GAA)) contacts 510G of the first semiconductor device 510. For example, a second dielectric layer 320 can be formed on the first dielectric layer 120 and the first metal structures 510S; a second etch mask (not shown) can be patterned and formed on the second dielectric layer 320; a portion of the second dielectric layer 320 that is not covered by the second etch mask can be etched to form second openings 330 that are separated from one another and define second rings or cylinders 330a each with one or more second contact extensions 330b protruding from a corresponding one of the second rings 330a; the second etch mask can then be stripped and removed; and metal, such as W, Co, Ru, or other high-conductive metals, can be deposited in the second openings 330 and planarized (e.g., CMP) to form second metal structures (or second level metal-first structure or connection segment) 510G that are electrically separated from one another. In an embodiment, the second metal structures 510G can include second rings 510Ga each with one or more second pad contacts or lines 510Gb extending from a corresponding one of the second rings 510Ga at different radial directions to different lengths for separate access from a position above the semiconductor structure 100. In the example embodiment, each of the second metal structure 510G can include a second ring 510Ga and a second pad contact 510Gb extending from the second ring 510Ga. The second metal structure 510G is electrically separated from the first metal structure 510S. The second metal structure 510G can be used to form a gate (e.g., gate-all-around (GAA)) contact 510G of the first semiconductor device 510, and the channel structure of the first semiconductor device 510 can also be formed within the second ring 510Ga of the second metal structure 510G. In the example embodiment, each of the second rings 510Ga is vertically aligned with a corresponding one of the first rings 510Sa.

Refer to FIGS. 4A, 4B, 4C and 4D, which show a top view, a top inner view, a cross-sectional view, and a schematic view of the semiconductor structure 100 with third metal structures further formed, respectively, according to some embodiments of the present disclosure. The process steps performed in FIGS. 3A, 3B, 3C and 3D can be repeated here to form within a third dielectric layer 420 third metal structures 510D that can be used as drain contacts 510D of the first semiconductor device 510. The third metal structure 510D is electrically separated from the second metal structure 510G and the first metal structure 510S. In an embodiment, the third metal structures 510D can include third rings 510Da each with one or more third pad contacts or lines 510Db extending from a corresponding one of the third rings 510Da. In the example embodiment, each of the third rings 510Da is vertically aligned with a corresponding one of the second rings 510Ga and a corresponding one of the first rings 510Sa.

Refer to FIGS. 5A, 5B, 5C and 5D, which show a top view, a top inner view, a cross-sectional view, and a schematic view of the semiconductor structure 100 with second and third semiconductor devices further formed, respectively, according to some embodiments of the present disclosure. For example, the process steps performed in FIGS. 4A, 4B, 4C and 4D can be repeated for another six times to form a second semiconductor device 520 and a third semiconductor device 530 sequentially. The second semiconductor device 520, the third semiconductor device 530 and the first semiconductor device 510 are electrically separated from one another. Each of the second semiconductor device 520 and the third semiconductor device 530 can include a source contact 520S/530S, a gate (GAA) contact 520G/530G and a drain contact 520D/530D, each of which can include a ring and one or more pad contacts or lines extending from the ring. For example, the drain contact 530D of the third semiconductor device 530 can include a ring 530Da and a pad contact 530Db extending from the ring 530Da. The second semiconductor device 520 and the third semiconductor device 530 are vertically stacked on the first semiconductor device 510 with the rings of the source, gate and drain contacts vertically aligned with one another. FIGS. 5A, 5B, 5C and 5D show three semiconductor devices, i.e., the first to third semiconductor devices 510 to 530 (a total of nine layers of metal-first structures) that are stacked vertically over the substrate 110. In some other embodiments of the present disclosure, one, two, or more than three semiconductor devices can be stacked vertically over the substrate 110. In the example embodiment, the ends of the pad contacts 530Sb and 530Gb with their corresponding rings 530Sa (located in a left portion of the semiconductor structure 100) and 530Ga (located in a right portion of the semiconductor structure 100) not aligned with each other are not overlapped. In some embodiments, the ends of the pad contacts 530Sb and 530Gb can have their radial directions and lengths modified such that they are overlapped. In the example embodiment, interconnections can be formed based on design of a SRAM device.

Refer to FIGS. 6A, 6B, 6C and 6D, which show a top view, a top inner view, a cross-sectional view, and a schematic view of the semiconductor structure 100 with interconnections further formed, respectively, according to some embodiments of the present disclosure. An interconnection etch mask (not shown) can be patterned and formed on the third semiconductor device 530. A portion of the third semiconductor device 530 and the second and first semiconductor devices 520 and 510 thereunder that is not covered by the interconnection etch mask can be etched to form openings, and metal, such as W, Co Ru, or other high-conductive metals, can be deposited in the openings and planarized (e.g., CMP) to form interconnections 610. The interconnection etch mask can then be stripped and removed. The dielectric layers of the first to third semiconductor devices 510 to 530 are referred to as a dielectric layer 620 collectively hereinafter.

Refer to FIGS. 7A, 7B, 7C and 7D, which show a top view, a top inner view, a cross-sectional view, and a schematic view of the semiconductor structure 100 with first to third channel structures of the first to third semiconductor devices 510 to 530 further formed, respectively, according to some embodiments of the present disclosure. A dielectric layer (or etch mask) 740 can be patterned and formed on the third semiconductor device 530. A portion of the dielectric layer 740 and the first to third semiconductor devices 510 to 530 thereunder that is not covered by the etch mask can be etched to form openings 750 to uncover the substrate 110 and inner radius surfaces of the vertically aligned rings of the metal structures of the first to third semiconductor devices 510 to 530, and channel structures can be formed in the openings 750. For example, within the openings 750 a first sacrificial layer 710$s$, e.g., SiGe, can be epitaxially grown and formed on the substrate 110, a first channel material, e.g., p-type or n-type, can be epitaxially grown and formed on the first sacrificial layer 710$s$, stopping at the gate contact 510G to form a gate (e.g., a high-k material) 710$g$ of the first semiconductor device 510, and the first channel material continues to grow to complete a first channel structure 710; a second sacrificial layer 720$s$, e.g., SiGe, can be epitaxially grown and formed on the first channel structure 710, a second channel material, e.g., p-type or n-type, can be epitaxially grown and formed on the second sacrificial layer 720$s$, stopping at the gate contact 520G to form a gate (e.g., a high-k material) 720$g$ of the second semiconductor device 520, and the second channel material continues to grow to complete a second channel structure 720; a third sacrificial layer 730$s$, e.g., SiGe, can be epitaxially grown and formed on the second channel structure 720, and a third channel material, e.g., p-type or n-type, can be epitaxially grown and formed on the third sacrificial layer 730$s$, stopping at the gate contact 530G to form a gate (e.g., a high-k material) 730$g$ of the third semiconductor device 530, and the third channel material continues to grow to complete a third channel structure 730. In the example embodiment, each of the openings 750 has a radius equal to an inner radius of each of the corresponding vertically aligned rings. In the example embodiment, the first and second semiconductor devices 510 and 520 can be n-type semiconductor devices (e.g., NMOS), and the third semiconductor device 530 can be a p-type semiconductor device (e.g., PMOS). Note that there may be some epitaxial growth on the metal-first structures depending on metal used and epitaxial material grown. Accordingly, a directional etch can be used during the vertical channel structure formation process to clean off epitaxial material from the metal-first structures. Alternatively, the inner surfaces of the metal-first structures can be stepwise protected with a thin film followed by stepwise removal of the thin film for each layer being grown, or full removal and re-deposition for each level.

FIGS. 8A, 8B, 8C, 8D and 8E show various views of the complete semiconductor structure 100 according to some embodiments of the present disclosure. For easier visualization, the dielectric layers (e.g., "620" and "740") are not shown in FIGS. 8A, 8B, 8C, 8D and 8E, and the interconnections 610 are also not shown in FIG. 8E. In the example embodiment, the semiconductor structure 100 can include a total of six semiconductor devices, e.g., two pairs of the first to third semiconductor devices 510 to 530.

As can be appreciated, there are various options and alternative embodiments contemplated herein. For epitaxial growth, two or more types of semiconductor materials can be grown, with different doping levels. Different semiconductor materials can be etched or removed selectively without removing remaining semiconductor materials. For example, SiGe can be removed by vapor phase etching without removing epitaxial silicon. This is beneficial because SiGe (or other material) can be grown at locations between vertical channel structures, e.g., the first to third channel structures 710 to 730, of vertical transistor devices, e.g., the first to third semiconductor devices 510 to 530. By removing the sacrificial SiGe layers, e.g., the first to third sacrificial layers 710s to 730s, the vertical channel structures become electrically separated from one another.

Refer to FIGS. 9A, 9B, 9C and 9D, which show a top view, a top inner view, a cross-sectional view, and a schematic view of the semiconductor structure 100 with cap layers and shafts or holes further formed, respectively, according to some embodiments of the present disclosure. In an embodiment, a cap layer 910, e.g., a dielectric layer, can be deposited and formed on the third channel structure 730 and planarized (e.g., CMP) to be leveled with the etch mask 740 to protect the first to third channel structures 710 to 730. In another embodiment, a shaft or hole 920 (at a side of the first to third semiconductor devices 510 to 530), which enables access to remove the first to third sacrificial layers 710s to 730s, can be formed from the top of the stack of layers, e.g., the first to third semiconductor devices 510 to 530, to the top of the substrate 110, to uncover the substrate 110 and the first to third sacrificial layers 710s to 730s, in order for the first to third sacrificial layers 710s to 730s to be removed.

Refer to FIGS. 10A, 10B, 10C and 10D, which show a top view, a top inner view, a cross-sectional view, and a schematic view of the semiconductor structure 100 with a portion of the first to third semiconductor devices 510 to 530 removed, respectively, according to some embodiments of the present disclosure. In an embodiment, the dielectric layer 620 of the first to third semiconductors 510 to 530 can be selectively etched (e.g., wet etching) with respect to the etch mask 740 (shown in FIGS. 9A and 9C) via, for example, directional etching, to uncover the first to third sacrificial layers 710s to 730s. The etch mask 740 can then be stripped and removed.

Refer to FIGS. 11A, 11B, 11C and 11D, which show a top view, a top inner view, a cross-sectional view, and a schematic view of the semiconductor structure 100 with the first to third sacrificial layers 710s to 730s removed, respectively, according to some embodiments of the present disclosure. In an embodiment, the uncovered or accessible first to third sacrificial layers 710s to 730s can be etched (e.g., wet etching or isotropic etching) and removed, and a dielectric material 940 can be deposited to fill a space that is formed after the dielectric layer 620 of the first to third semiconductor devices 510 to 530 are removed and planarized to be leveled with the interconnections 610, with first to third air gaps 1110 to 1130 that electrically separate the substrate 110 and the first to third channel structures 710 to 730 being formed at locations where the first to third sacrificial layers 710s to 730s are formed previously. For example, the first air gap 1110 can electrically separate the substrate 110 from the first channel structure 710, the second air gap 1120 can electrically separate the first channel structure 710 from the second channel structure 720, and the third air gap 1130 can electrically separate the second channel structure 720 from the third channel structure 730.

Refer to FIGS. 12A, 12B, 12C and 12D, which show a top view, a top inner view, a cross-sectional view, and another cross-sectional view of the semiconductor structure 100 with padding layers to be formed, respectively, according to some embodiments of the present disclosure. In an embodiment, a dielectric layer 1210 can be deposited and formed to cover the dielectric layers 620 and 940, the interconnections 610 and the cap layer 910. An interconnection etch mask (not shown) can be patterned and formed on the dielectric layer 1210 to uncover the interconnections 610 to form openings 1220 for padding layers and interconnections as per 3D SRAM Scheme example to be formed therein.

Figure 13D:
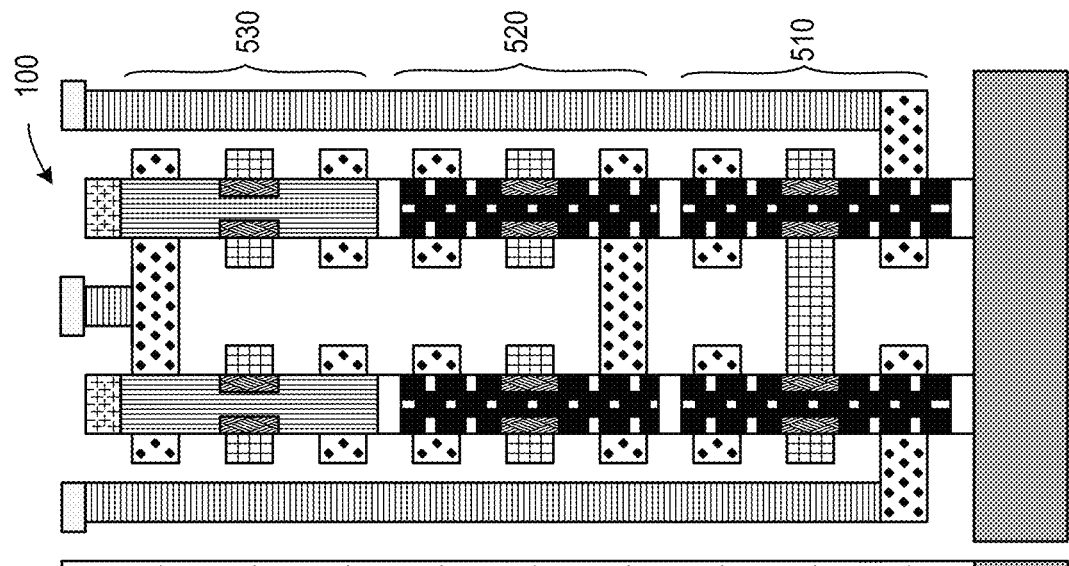
FIGS. 13A, 13B, 13B', 13C and 13D show a top view, a top inner view, another top inner view, a cross-sectional view, and another cross-sectional view of the semiconductor structure with paddings layers formed, respectively, according to some embodiments of the present disclosure.
Figure 13C:
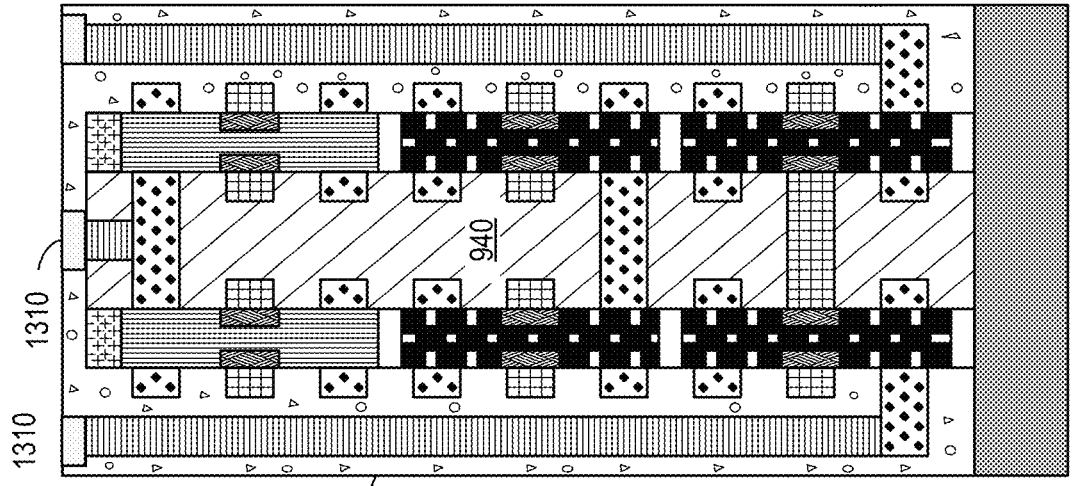
Figure 13A:
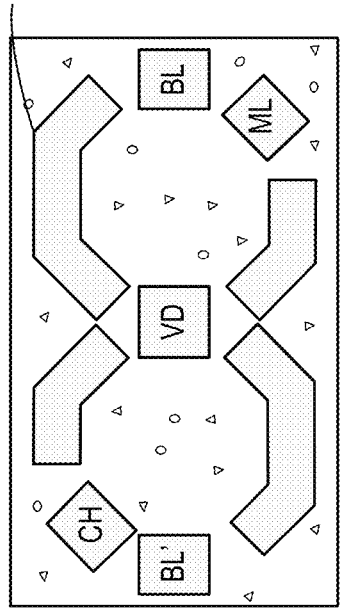
Figure 13B:
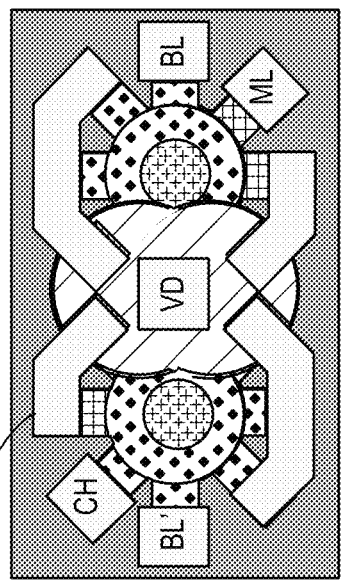
Figure 13B:
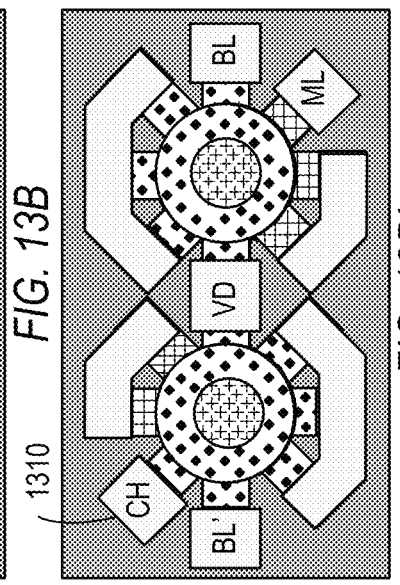
Figure 15D:
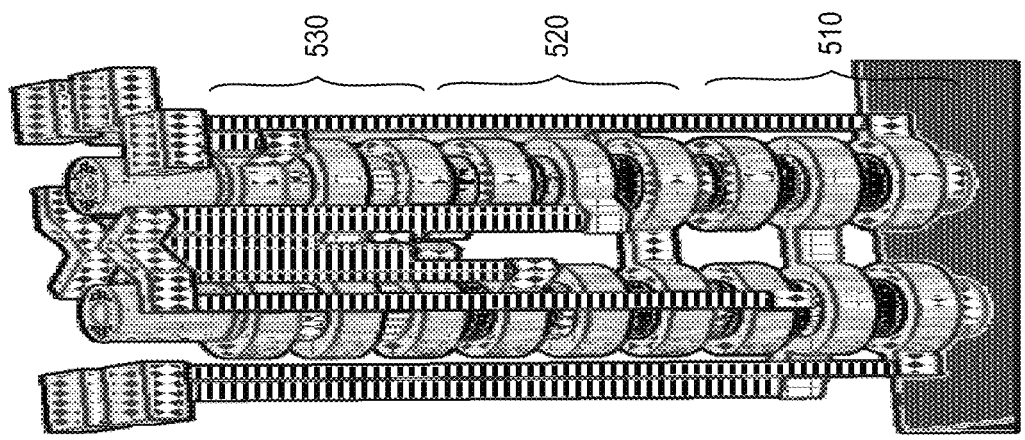
FIGS. 15A, 15B, 15C and 15D show a top view, a top inner view, a cross-sectional view, and a schematic view of another semiconductor structure, respectively, according to some embodiments of the present disclosure.
Figure 15C:
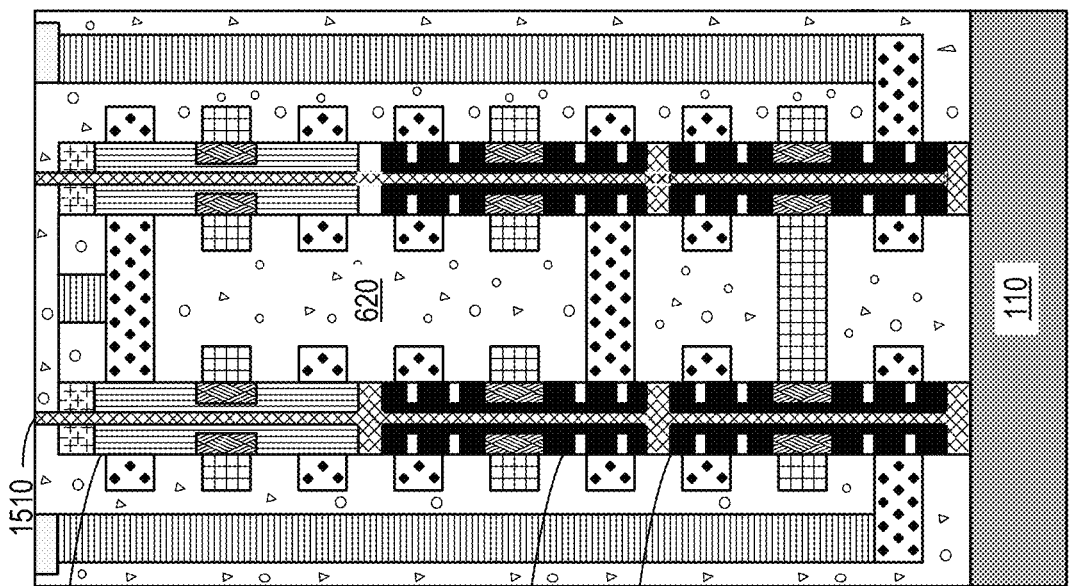
Figure 15A:
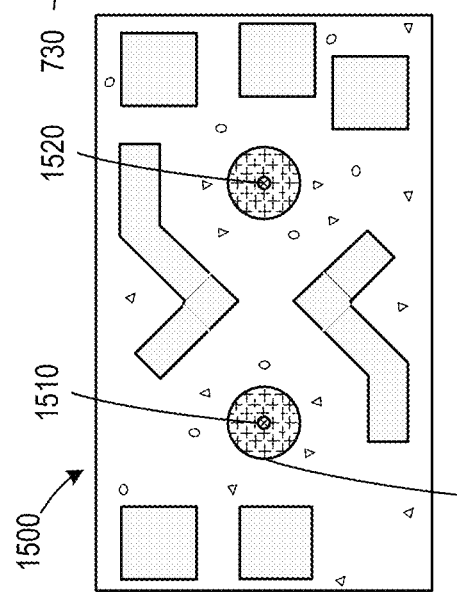
Figure 15B:
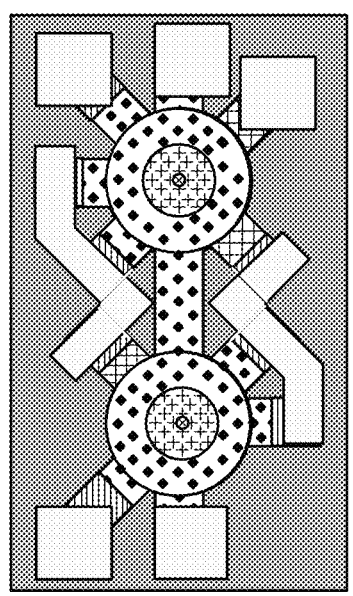
Figure 20D:
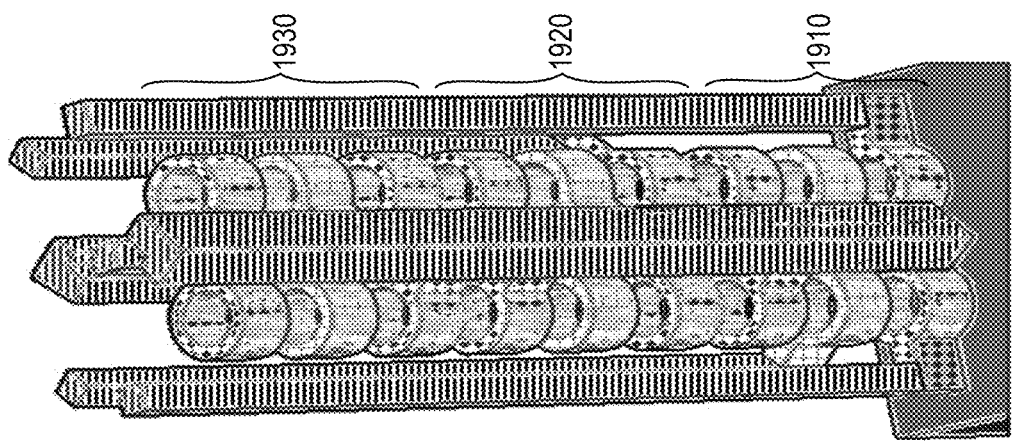
FIGS. 20A, 20B, 20C and 20D show a top view, a top inner view, a cross-sectional view, and a schematic view of the semiconductor structure with interconnections further formed, respectively, according to some embodiments of the present disclosure.
Figure 20C:
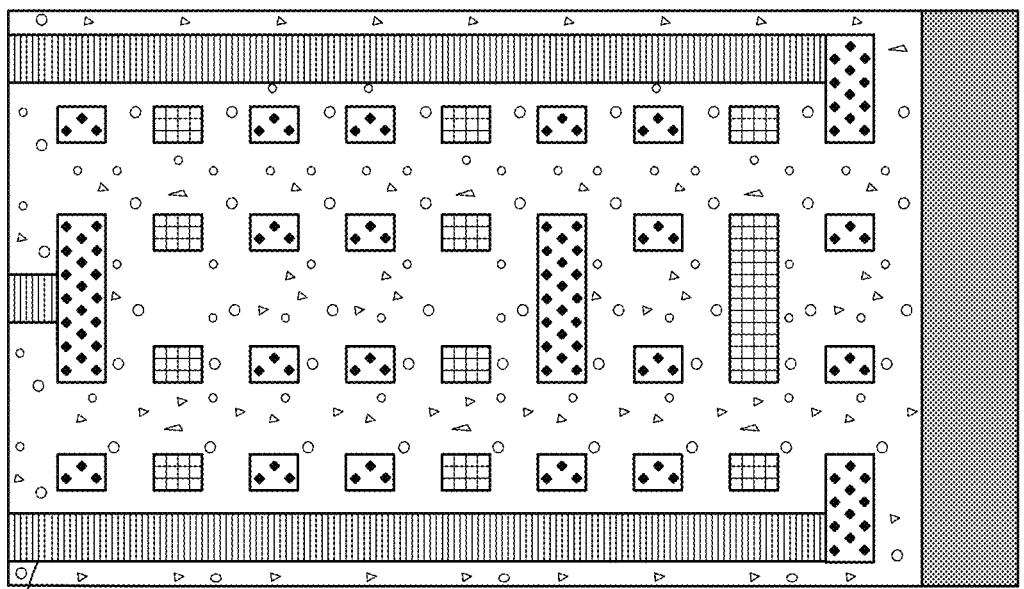
Figure 20A:
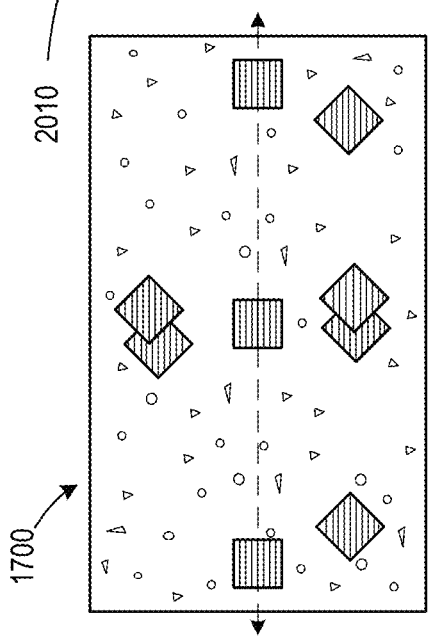
Figure 20B:
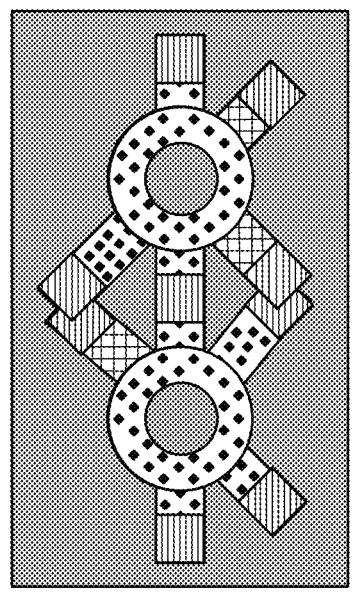
Figure 21D:
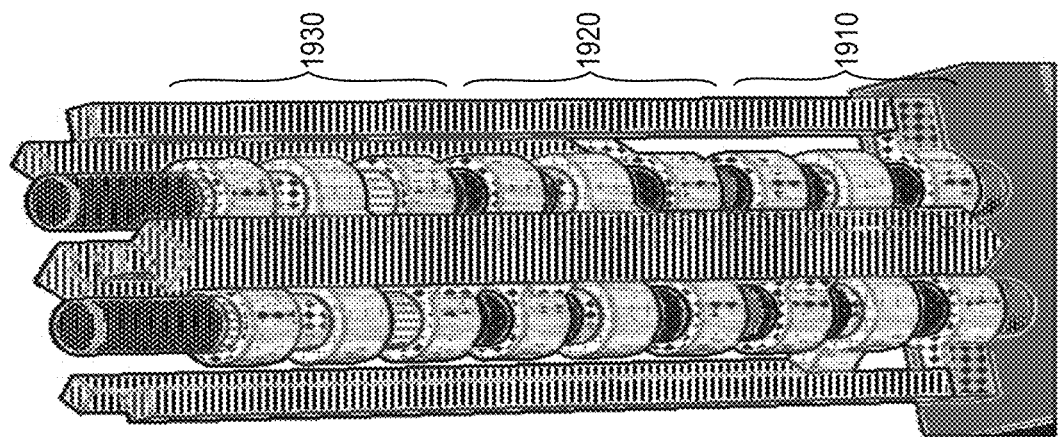
FIGS. 21A, 21B, 21C and 21D show a top view, a top inner view, a cross-sectional view, and a schematic view of the semiconductor structure with first to third channel structures of the first to third semiconductor devices further formed, respectively, according to some embodiments of the present disclosure.
Figure 21C:
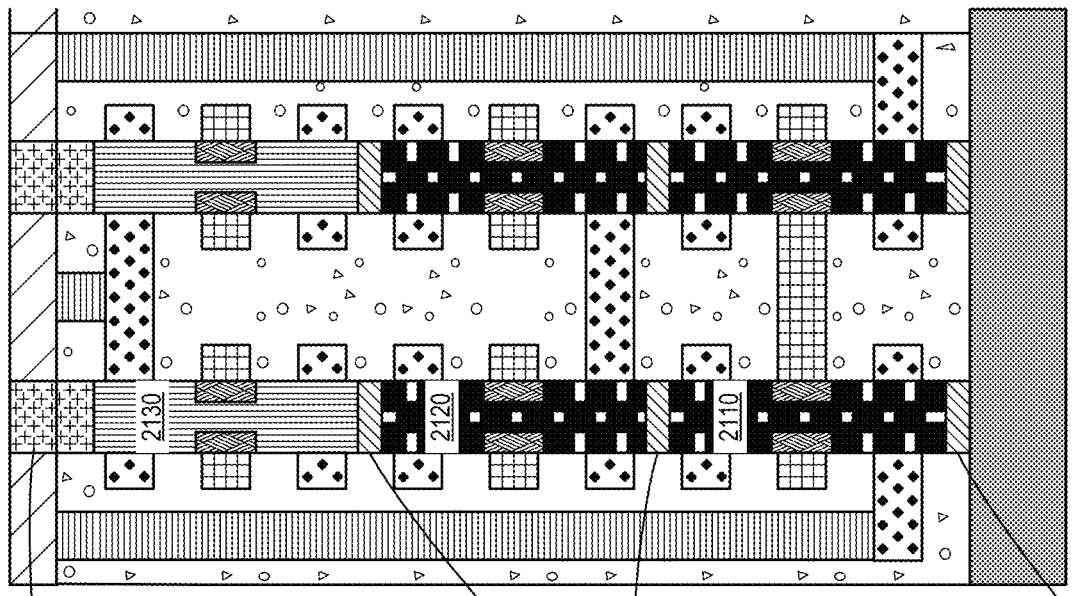
Figure 21A:
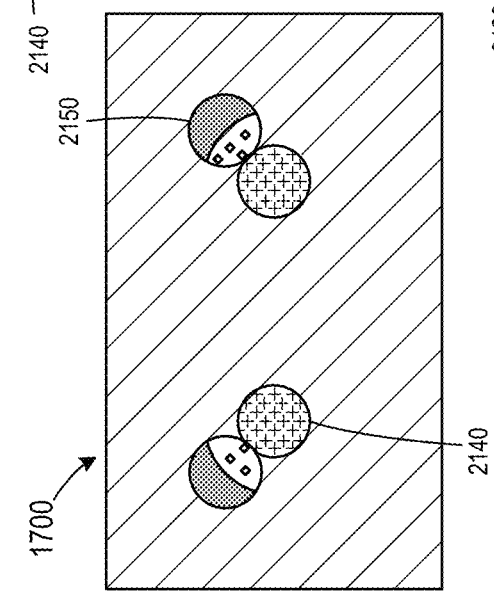
Figure 21B:
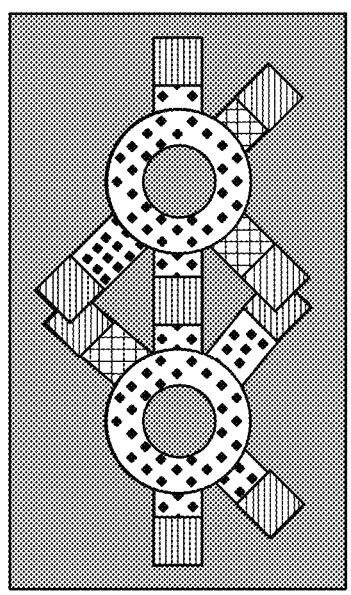
Figure 22D:
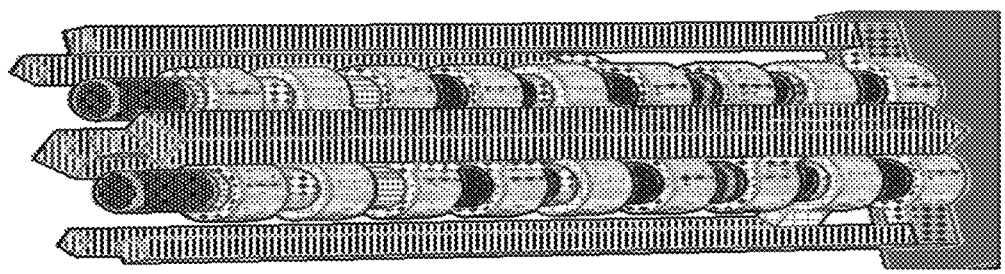
FIGS. 22A, 22B, 22C, 22D and 22D' show a top view, a top inner view, a cross-sectional view, a schematic view, and another schematic view of the semiconductor structure with the first to third sacrificial layers removed, respectively, according to some embodiments of the present disclosure.
Figure 22D:
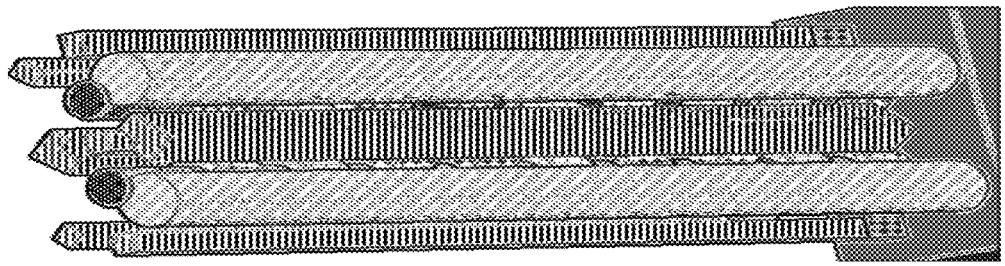
Figure 22C:
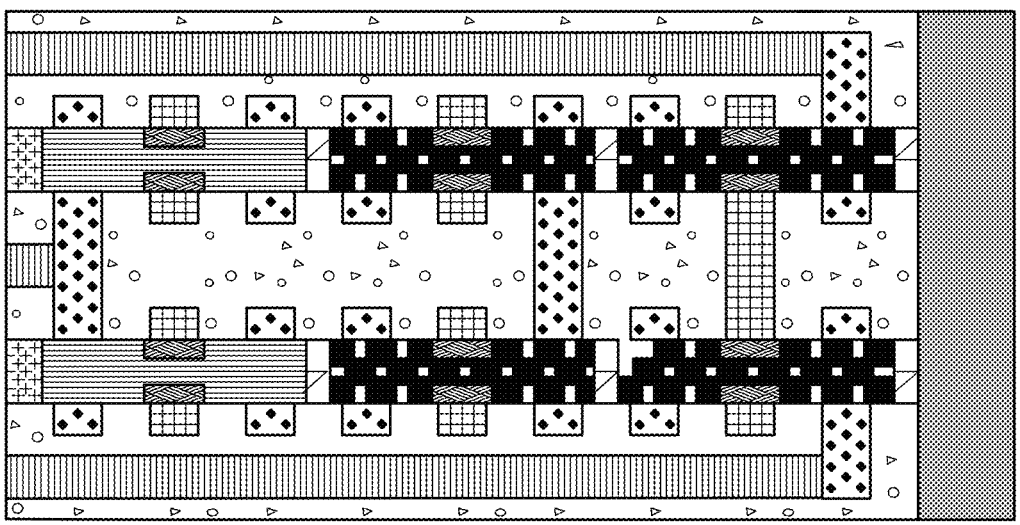
Figure 22A:
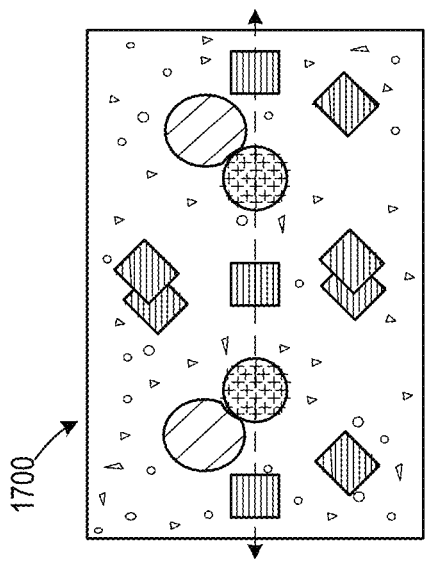
Figure 22B:
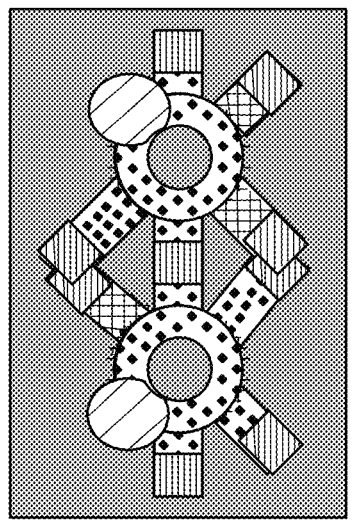

Refer to FIGS. 13A, 13B, 13B', 13C and 13D, which show a top view, a top inner view, another top inner view, a cross-sectional view, and another cross-sectional view of the semiconductor structure 100 with paddings layers formed, respectively, according to some embodiments of the present disclosure. In an embodiment, the dielectric layer 1210 (shown in FIG. 12C) can be etched and removed, and metal can be deposited in the openings 1220 (shown in FIGS. 12A and 12C) and planarized (e.g., CMP) to form padding layers 1310 to complete a multi-dimensional metal-first SRAM of stacked vertical semiconductor devices, e.g., the first to third semiconductor devices 510 to 530, which can be vertical NMOS or PMOS.

FIGS. 14A, 14B, 14C, 14D and 14E show various views of the complete semiconductor structure 100 according to some embodiments of the present disclosure. For easier visualization, the dielectric layers (e.g., "620" and "940") are not shown.

Refer to FIGS. 15A, 15B, 15C and 15D, which show a top view, a top inner view, a cross-sectional view, and a schematic view of a semiconductor structure 1500, respectively, according to some embodiments of the present disclosure. FIGS. 15A, 15B, 15C and 15D follow FIGS. 7A, 7B, 7C and 7D, respectively. Instead of the formation of the shaft or hole 920, as shown in FIGS. 9A, 9B, 9C and 9D, a trench hole 1520 is formed by etching the inner core of the first to third channel structures 710 to 730 and the first to third sacrificial layers 710s to 730s, and the trench hole 1520 is filled with a dielectric layer 1510. The dielectric layer 1510 that fills the spaces where the first to third sacrificial layers 710s to 730s (shown in FIGS. 7A, 7B, 7C and 7D) are formed previously can electrically separate the substrate 110 and the first to third channel structures 710 to 730.

Refer to FIGS. 16A, 16B, 16C and 16D, which show a top view, a top inner view, a cross-sectional view, and a schematic view of a semiconductor structure 1600, respectively, according to some embodiments of the present disclosure. The semiconductor structure 1600 differs from the semiconductor structure 1500 in that in the semiconductor structure 1600 the spaces where the first to third sacrificial layers 710s to 730s are formed previously are not filled with the dielectric layer 1510 to form first to third air gaps 1610 to 1630 that electrically separate the substrate 110 and the first to third channel structures 710 to 730. For example, the first air gap 1610 can electrically separate the substrate 110 from the first channel structure 710, the second air gap 1620 can electrically separate the first channel structure 710 from the second channel structure 720, and the third air gap 1630 can electrically separate the second channel structure 720 from the third channel structure 730.

Compact designs are enabled herein. Advantages of hierarchy design have been exercised to interconnect the nodes under same vertical area while they are actually separated by different horizontal plane. The metal-first design according to some aspects of the present disclosure gives enormous freedom to customize the fabrication steps as per the design and make it super compact and highly dense.

Refer to FIGS. 17A, 17B, 17C and 17D, which show a top view, a top inner view, a cross-sectional view, and a schematic view of a semiconductor structure 1700 that is formed after five layers of metal (metal-first) structures are formed, respectively, according to some embodiments of the present disclosure. In the example embodiment, the semiconductor structure 1700 can include source, gate (GAA) and drain contacts 1910S, 1910G and 1910D of a first semiconductor device 1910 (shown in FIG. 19D) and source and gate (GAA) contacts 1920S and 1920G of a second semiconductor device 1920 (shown in FIG. 19D). The pad contacts or lines of the source, gate and drain contacts 1910S, 1910G and 1910D of the first semiconductor device 1910 and the source and gate contacts 1920S and 1920G of the second semiconductor device 1920 can differ from the pad contacts or lines of the source, gate and drain contacts 510S, 510G and 510D of the first semiconductor device 510 and the source and gate contacts 520S and 520G of the second semiconductor device 520 in radial directions and lengths. Here customized designed can be followed based on the circuit requirement which is SDRAM. So that interconnections can be done during each layer rather than interconnecting at the final layer.

Refer to FIGS. 18A, 18B, 18C and 18D, which show a top view, a top inner view, a cross-sectional view, and a schematic view of the semiconductor structure 1700 with the sixth metal (metal-first) structure further formed, respectively, according to some embodiments of the present disclosure. In an embodiment, a drain contact 1920D of the second semiconductor device 1920 (shown in FIG. 19D) can be formed above the gate contact 1920G of the second semiconductor device 1920. In the example embodiment, the gate contact 1920G is exactly aligned with the drain contact 1910D. However, the gate contact 1920G has a shorter horizontal length (or a shorter pad contact) than the drain contact 1910D. Since both would be shorted including the second gate metal, as per circuit design, it has been placed like that to easily connect by single metal strip.

Refer to FIGS. 19A, 19B, 19C and 19D, which show a top view, a top inner view, a cross-sectional view, and a schematic view of the semiconductor structure 1700 with the last three metal (metal-first) structures further formed, respectively, according to some embodiments of the present disclosure. In an embodiment, source, gate (GAA) and drain contacts 1930S, 1930G and 1930D of a third semiconductor device 1930 are formed over the second semiconductor device 1920 sequentially. In the example embodiments, the nine metal structures are vertical aligned, but electrically separated from one another.

Refer to FIGS. 20A, 20B, 20C and 20D, which show a top view, a top inner view, a cross-sectional view, and a schematic view of the semiconductor structure 1700 with interconnections further formed, respectively, according to some embodiments of the present disclosure. In an embodiment, an interconnection etch mask (not shown) can be patterned and formed on the third semiconductor device 1930. A portion of the third semiconductor device 1930 and the second and first semiconductor devices 1920 and 1910 thereunder that is not covered by the interconnection etch mask can be etched to form openings, and metal, such as W, Co Ru, or other high-conductive metals, can be deposited in the openings and planarized (e.g., CMP) to form interconnections 2010. The interconnection etch mask can then be stripped and removed.

Refer to FIGS. 21A, 21B, 21C and 21D, which show a top view, a top inner view, a cross-sectional view, and a schematic view of the semiconductor structure 1700 with first to third channel structures of the first to third semiconductor devices 1910 to 1930 further formed, respectively, according to some embodiments of the present disclosure. In an embodiment, first to third sacrificial layers 2110s to 2130s, first to third channel structures 2110 to 2130, a cap layer 2140 and shafts or holes 2150 can be formed by referring to the process steps performed in FIGS. 7A, 7B, 7C and 7D and FIGS. 9A, 9B, 9C and 9D.

Refer to FIGS. 22A, 22B, 22C, 22D and 22D', which show a top view, a top inner view, a cross-sectional view, a schematic view, and another schematic view of the semiconductor structure 1700 with the first to third sacrificial layers 2110s to 2130s (shown in FIG. 21C) removed, respectively, according to some embodiments of the present disclosure. In an embodiment, the first to third sacrificial layers 2110s to 2130s can be etched and removed entirely or partially by referring to the process steps performed in FIGS. 11A, 11B, 11C and 11D.

Refer to FIGS. 23A, 23B, 23B', 23C and 23D, which show a top view, a top inner view, another top inner view, a cross-sectional view, and a schematic view of the semiconductor structure 1700 with padding layers further formed, respectively, according to some embodiments of the present disclosure. In an embodiment, padding layers 2310 can be formed by referring to the process steps performed in FIGS. 12A, 12B, 12C and 12D and FIGS. 13A, 13B, 13C and 13D.

Refer to FIGS. 24A, 24B, 24C and 24D, which show a top view, a top inner view, a cross-sectional view, and a schematic view of a semiconductor structure 2400, respectively, according to some embodiments of the present disclosure. FIGS. 24A, 24B, 24C and 24D follow FIGS. 21A, 21B, 21C and 21D, respectively. Instead of the formation of the shaft or hole 2150, as shown in FIGS. 21A, 21B, 21C and 21D, a trench hole 2420 is formed by etching the inner core of the first to third channel structures 2110 to 2130 and the first to third sacrificial layers 2110s to 2130s (shown in FIG. 21C), and the trench hole 2420 is filled with a dielectric material 2410. The dielectric material 2410 that fills the spaces where the first to third sacrificial layers 2110s to 2130s (shown in FIGS. 21A, 21B, 21C and 21D) are formed previously can electrically separate the substrate 110 and the first to third channel structures 2110 to 2130. In an embodiment, the pad contacts of the metal structures of the semiconductor structure 2400 are not necessarily at radial directions. For example, a drain contact 2450D of a semiconductor device 2450 of the semiconductor structure 2400 has a ring 2450Da and a pad contact 2450Db that extends from the ring 2450Da, but the extension of the pad contact 2450Db does not pass the center of the ring 2450Da.

Figures 25A, 25B, 25C:
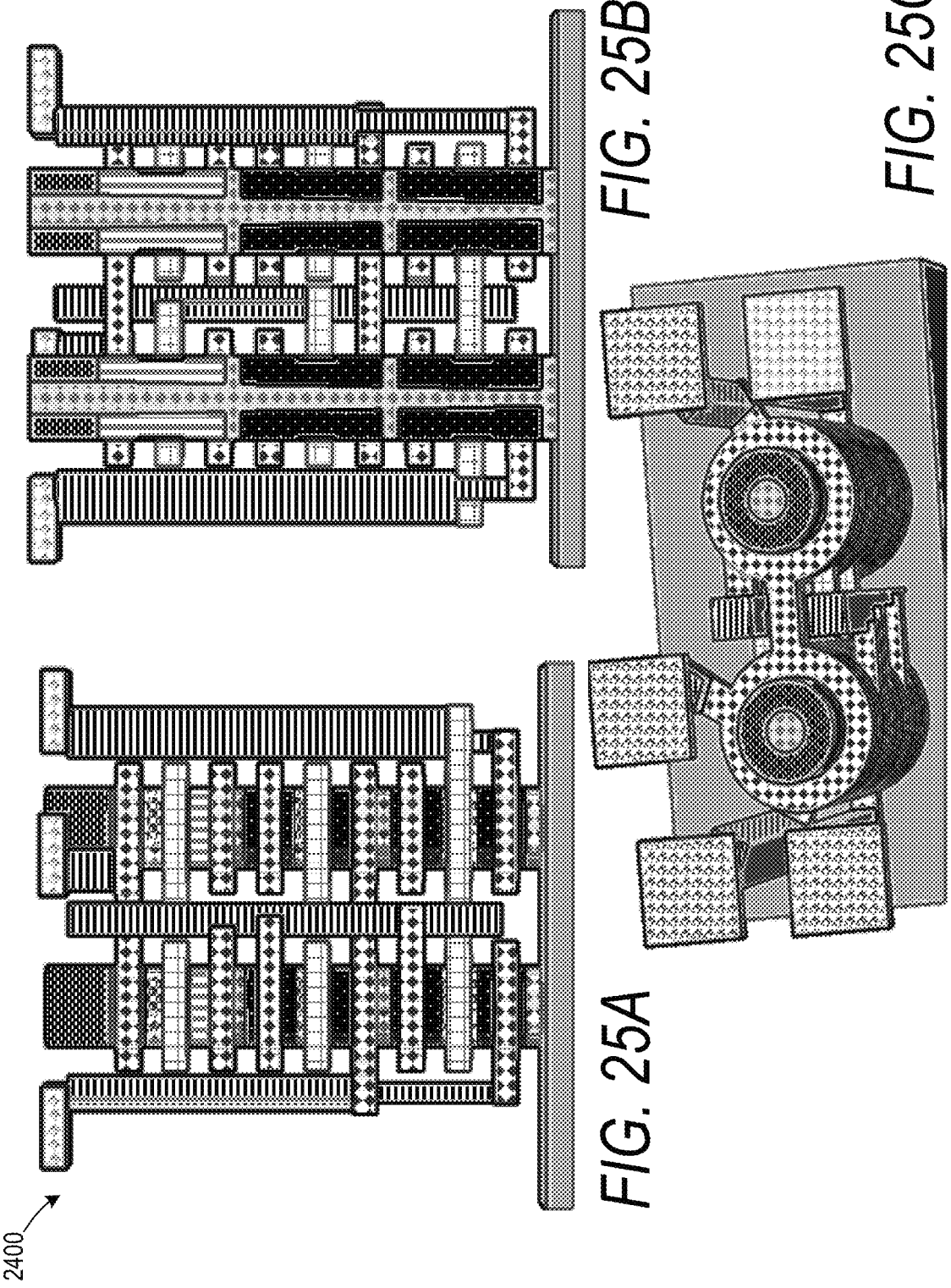
FIGS. 25A, 25B and 25C show various views of the complete semiconductor structure according to some embodiments of the present disclosure.

FIGS. 25A, 25B and 25C show various views of the complete semiconductor structure 2400 according to some embodiments of the present disclosure.

Figure 26:
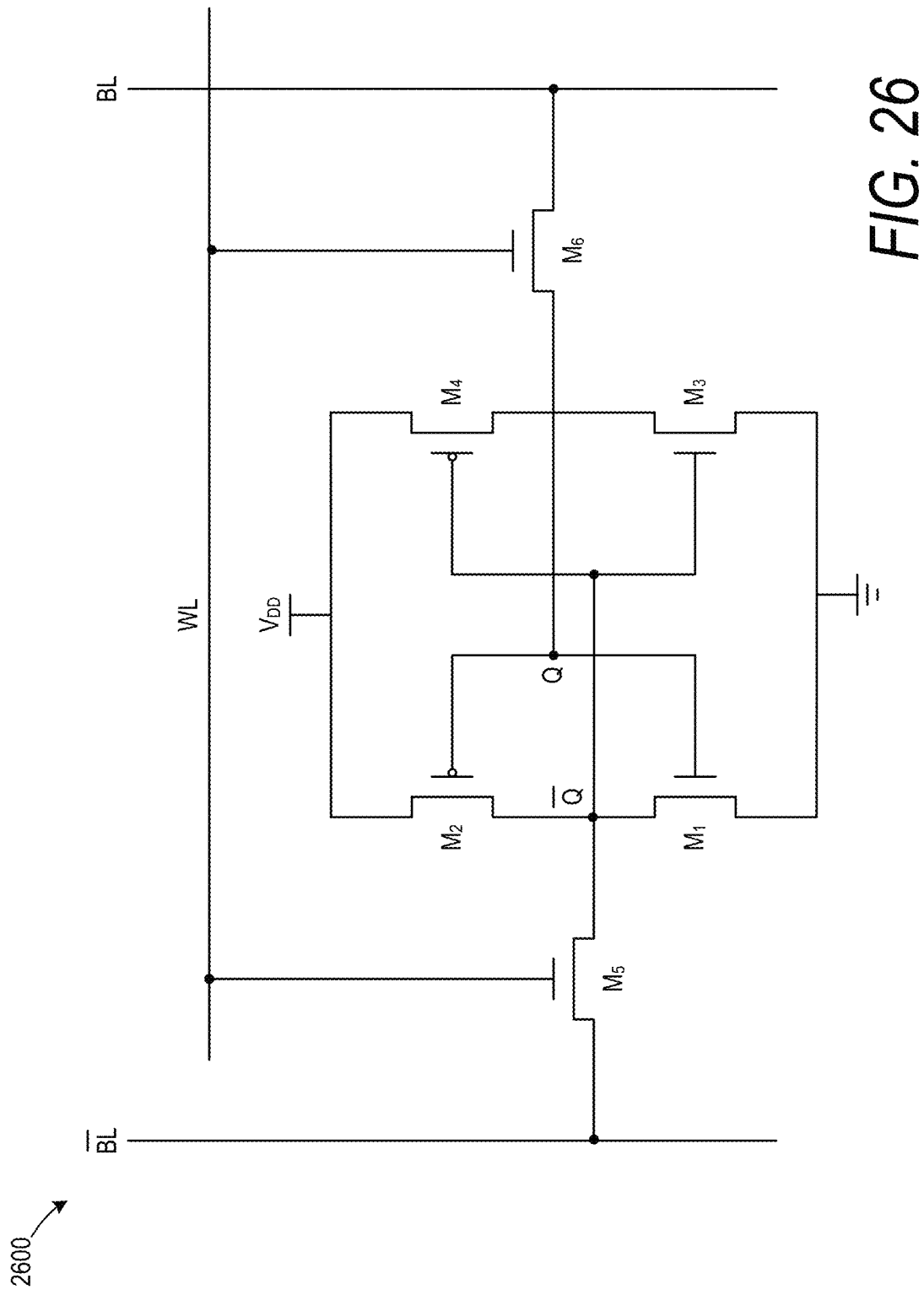
FIGS. 26 and 27 show example diagrams of an exemplary SRAM circuit according to some embodiments of the present disclosure.

FIG. 26 shows an example diagram of an exemplary SRAM circuit 2600 including the semiconductor structure 100, 1500, 1600, 1700 or 2400, for example, according to some embodiments of the present disclosure. Note, however, that techniques herein can apply to any discrete device or circuit consisting of devices using this 3D metal-first technique. For example, transistors $M_2$, $M_1$ and $M_5$ can represent the third to first semiconductor devices of a left portion of the semiconductor structure, which can be PMOS, NMOS and NMOS, respectively, and transistors $M_4$, $M_3$ and $M_6$ can represent the third to first semiconductor devices of a right portion of the semiconductor structure, which can be PMOS, NMOS and NMOS, respectively. PMOS $M_2$ and NMOS $M_1$ form an inverter. PMOS $M_4$ and NMOS $M_3$ form another inverter.

Figure 27:
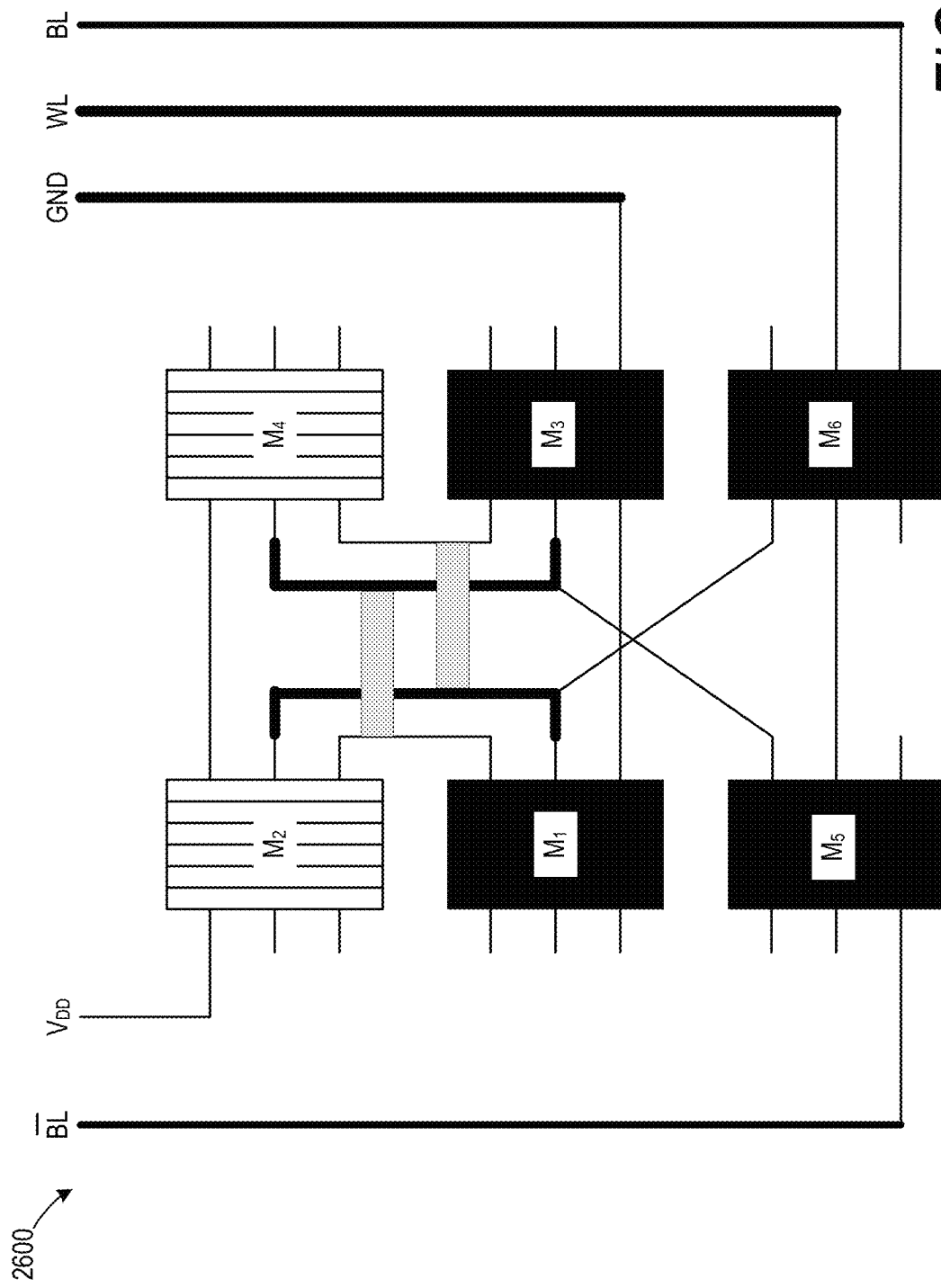

FIG. 27 shows another example diagram of the SRAM circuit 2600 according to some embodiments of the present disclosure. For example, The drains of the PMOSs $M_2$ and $M_4$ are coupled to a reference voltage $V_{DD}$, the sources of the NMOSs $M_1$ and $M_3$ are coupled to ground GND, and the gates of the NMOS $M_5$ and $M_6$ are coupled to a wordline WL, and the sources of the NMOSs $M_5$ and $M_6$ are coupled to bitlines $\overline{BL}$ and BL, respectively.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method for fabricating a semiconductor structure, comprising:
    forming a stack of metal structures on a substrate, the stack of metal structures including multiple metal structures that are vertically stacked over and electrically separated from one another, each of the metal structures including a ring and one or more pad contacts extending from the ring, the rings of the metal structures being vertically aligned with one another;
    forming one or more channel structures within the rings of the metal structures, the channel structures being electrically separated from one another and electrically separated from the substrate; and
    forming one or more interconnections that extend from a position above the stack of metal structures to corresponding one or more of the pad contacts of the metal structures.

2. The method of claim 1, wherein the pad contacts extend at radial directions.

3. The method of claim 2, wherein the pad contacts of two of the metal structures extend at a same redial direction.

4. The method of claim 1, wherein the pad contacts of two of the metal structures have different lengths.

5. The method of claim 1, wherein forming one or more channel structures includes:
    forming an opening through the stack of metal structures until uncovering the substrate;
    forming a sacrificial layer on the substrate;
    forming a channel structure on the sacrificial layer; and
    removing the sacrificial layer to form an air gap.

6. The method of claim 5, further comprising filling the air gap with a dielectric material.

7. The method of claim 6, wherein the air gap is partially filled with the dielectric material.

8. The method of claim 5, wherein removing the sacrificial layer includes:
    forming a shaft at a side of the stack of metal structures from top of the stack of metal structures to the substrate to uncover the sacrificial layer; and
    removing the sacrificial layer.

9. The method of claim 5, wherein removing the sacrificial layer includes:
    forming a trench hole in a core of the channel structures to uncover the substrate and the sacrificial layer; and
    removing the sacrificial layer.

10. The method of claim 5, wherein forming a sacrificial layer on the substrate includes epitaxially growing a sacrificial layer on the substrate.

11. The method of claim 5, wherein forming a channel structure on the sacrificial layer includes epitaxially growing a channel structure on the sacrificial layer.

12. The method of claim 1, wherein forming the stack of metal structures includes:
forming a dielectric layer on the substrate;
removing a portion of the dielectric layer to form one or more openings; and
filling the openings with metal to form the rings and the pad contacts.

13. A semiconductor structure, comprising:
a stack of metal structures, the stack of metal structures including multiple metal structures vertically stacked over and electrically separated from one another, each of the metal structures including a ring and one or more pad contacts extending from the ring, the rings of the metal structures being vertically aligned with one another;
one or more channel structures within the rings of the metal structures, the channel structures being electrically separated from one another; and
one or more interconnections that extend from a position above the stack of metal structures to corresponding one or more of the pad contacts of the metal structures.

14. The semiconductor structure of claim 13, wherein the pad contacts extend at radial directions.

15. The semiconductor structure of claim 14, wherein the pad contacts of two of the metal structures extend at a same redial direction.

16. The semiconductor structure of claim 13, wherein the pad contacts of two of the metal structures have different lengths.

17. The semiconductor structure of claim 13, further comprising an air gap formed between two of the channel structures.

18. The semiconductor structure of claim 17, further comprising a dielectric material filled in the air gap.

19. The semiconductor structure of claim 18, wherein the air gap is partially filled with the dielectric material.

20. The semiconductor structure of claim 13, wherein the channel structures include a p-type channel structure and an n-type channel structure.

* * * * *

UNITED STATES PATENT AND TRADEMARK OFFICE
CERTIFICATE OF CORRECTION

PATENT NO. : 12,288,747 B2  
APPLICATION NO. : 17/740691  
DATED : April 29, 2025  
INVENTOR(S) : Fulford et al.

Page 1 of 1

It is certified that error appears in the above-identified patent and that said Letters Patent is hereby corrected as shown below:

In the Claims

In Column 14, Claim 3, Line 40, delete "redial" and insert -- radial --, therefor.

In Column 16, Claim 15, Line 8, delete "redial" and insert -- radial --, therefor.

Signed and Sealed this  
Fourth Day of November, 2025

John A. Squires  
*Director of the United States Patent and Trademark Office*